United States Patent [19]
Isao et al.

[11] Patent Number: 5,830,607
[45] Date of Patent: Nov. 3, 1998

[54] PHASE SHIFT MASK AND MANUFACTURING METHOD THEREOF AND EXPOSURE METHOD USING PHASE SHIFT MASK

[75] Inventors: Akihiko Isao; Ryoichi Kobayashi, both of Saitama; Nobuyuki Yoshioka, Hyogo; Yaichiro Watakabe, Hyogo; Junji Miyazaki, Hyogo; Kouichiro Narimatsu, Hyogo; Shigenori Yamashita, Hyogo, all of Japan

[73] Assignees: Ulvac Coating Corporation, Saitama; Mitsubishi Denki Kabushiki Kaisha, Tokyo, both of Japan

[21] Appl. No.: 864,005

[22] Filed: May 27, 1997

Related U.S. Application Data

[60] Division of Ser. No. 547,520, Oct. 24, 1995, Pat. No. 5,674,647, which is a continuation-in-part of Ser. No. 155,370, Nov. 22, 1993, Pat. No. 5,474,864.

[30] Foreign Application Priority Data

Nov. 21, 1992 [JP] Japan ................... 4-335523
Apr. 19, 1993 [JP] Japan ................... 5-091445
Nov. 15, 1993 [JP] Japan ................... 5-285327

[51] Int. Cl.[6] ............................ G03F 9/00
[52] U.S. Cl. ................................ 430/5
[58] Field of Search .................. 430/22, 5, 394; 356/390, 394

[56] References Cited

U.S. PATENT DOCUMENTS

| | | |
|---|---|---|
| 4,359,490 | 11/1982 | Lehrer . |
| 4,661,426 | 4/1987 | Matsuda et al. . |
| 4,678,714 | 7/1987 | Watakabe . |
| 4,717,625 | 1/1988 | Watakabe et al. . |
| 4,722,878 | 2/1988 | Watakabe et al. . |
| 4,738,907 | 4/1988 | Shigetomi et al. . |
| 4,783,371 | 11/1988 | Watakabe et al. . |
| 4,792,461 | 12/1988 | Watakabe et al. . |
| 4,873,163 | 10/1989 | Watakabe et al. . |
| 4,957,834 | 9/1990 | Matsuda et al. . |
| 5,235,400 | 8/1993 | Terasawa et al. ............ 356/237 |
| 5,286,581 | 2/1994 | Lee . |
| 5,353,116 | 10/1994 | Tanigawa et al. ............ 356/390 |

FOREIGN PATENT DOCUMENTS

| | | |
|---|---|---|
| 57-62052 | 4/1982 | Japan . |
| 58-1734744 | 10/1983 | Japan . |
| 3-141354 | 6/1991 | Japan . |
| 3-267940 | 11/1991 | Japan . |
| 4-136854 | 5/1992 | Japan . |
| 5-12731 | 5/1993 | Japan . |
| 6-75360 | 3/1994 | Japan . |

*Primary Examiner*—S. Rosasco
*Attorney, Agent, or Firm*—McDermott, Will & Emery

[57] ABSTRACT

A second light transmit portion of a phase shift mask is formed of a molybdenum silicide nitride oxide, or a molybdenum silicide oxide, or a chromium nitride oxide, or a chromium oxide, or a chromium carbide nitride oxide film converting a phase of transmitted exposure light by 180° and having the transmittance of at least 2% and less than 5%. In the manufacturing method of the second light transmit portion, a molybdenum silicide nitride oxide film, or a molybdenum silicide oxide film, or a chromium nitride oxide film, or a chromium oxide film, or a carbide nitride oxide film is formed by a sputtering method. Consequently, with a conventional sputtering apparatus, the second light transmit portion can be formed, and additionally, etching process of the phase shifter portion is required only once, so that probabilities of defects and errors in the manufacturing process can be decreased.

3 Claims, 33 Drawing Sheets

FIG. 1
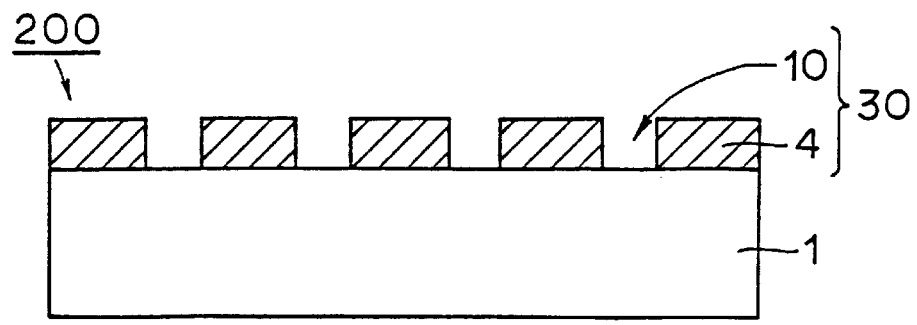
FIG. 2A
FIG. 2B
ELECTRIC FIELD
OF LIGHT ON MASK
FIG. 2C
LIGHT INTENSITY
ON WAFER
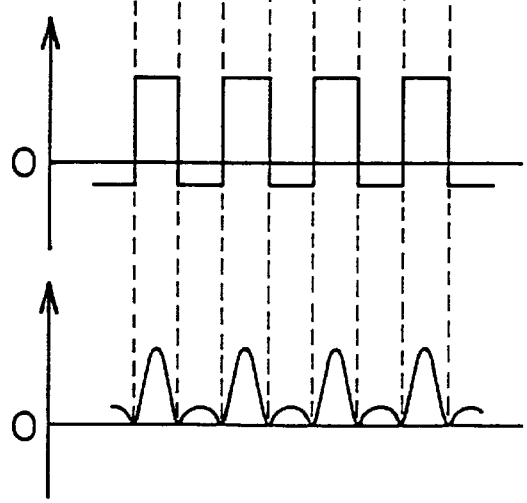

FIG.39

| T% | D.O.F | ΔD.O.F% for Normal |
|---|---|---|
| Normal (T=0%) | 1.04 | — |
| 1% | 1.10 | +5% |
| 3% | 1.25 | +20% |
| 5% | 1.42 | +37% |

ELECTRIC FIELD
OF LIGHT ON MASK

LIGHT INTENSITY
ON WAFER

ELECTRIC FIELD
OF LIGHT ON MASK

LIGHT INTENSITY
ON WAFER

FIG.46A PRIOR ART
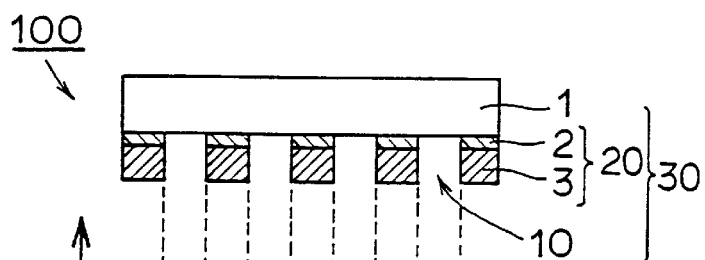
FIG.46B PRIOR ART
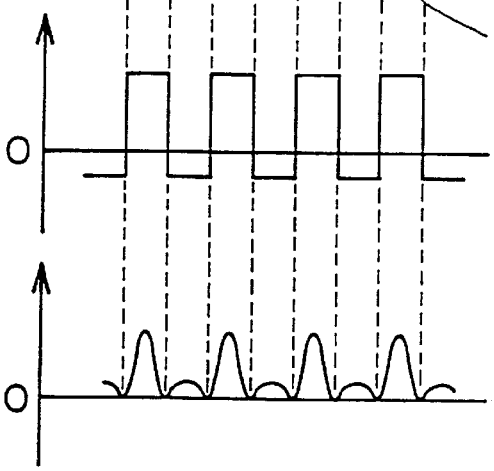
ELECTRIC FIELD
OF LIGHT ON MASK
FIG.46C PRIOR ART
LIGHT INTENSITY
ON WAFER

PHASE SHIFT MASK AND MANUFACTURING METHOD THEREOF AND EXPOSURE METHOD USING PHASE SHIFT MASK

This application is a division of application Ser. No. 08/547,520 filed Oct. 24, 1995, now U.S. Pat. No. 5,674,647, which is a Continuation-In-Part of application Ser. No. 08/155,370 filed Nov. 22, 1993, now U.S. Pat. No. 5,474,864.

BACKGROUND OF THE INVENTION

1. Field of the Invention

The present invention relates generally to phase shift masks, and particularly to a structure of a phase shift mask of attenuation type attenuating light intensity, and a method of manufacturing the same. The present invention further relates to an exposure method using the phase shift mask.

2. Description of the Background Art

Recently, high integration and miniaturization of a semiconductor integrated circuit has been remarkably advanced, involving miniaturization of a circuit pattern formed on a semiconductor substrate (hereinafter referred to simply as a wafer).

In particular, a photolithography technique is well known as a basic technique in pattern formation. Although various developments and improvements have been made, miniaturization of a pattern still keeps on advancing, and a demand for enhancement of a pattern resolution has been increasing.

In general, a resolution limit R (nm) in a photolithography technique using a reduction exposure method is described by the following:

$$R = k_1 \cdot \lambda / (NA) \quad (1)$$

where $\lambda$ is a wavelength (nm) of light to be used, NA is a numerical aperture of a lens, and $K_1$ is a constant which depends on a resist process.

As can be seen from the above expression, in order to enhance the resolution limit, $K_1$ and $\lambda$ should be made smaller, and NA should be made larger. That is, the wavelength should be decreased, and NA should be increased, with the constant which depends on a resist process made smaller.

However, improvement of a light source and a lens is technically difficult. In addition, a depth of focus $\delta$ ($\delta = k_2 \cdot \lambda / (NA)^2$) of light is made smaller by decreasing the wavelength and increasing NA, which rather leads to deterioration in the resolution.

Description will now be made of a cross section of a mask, an electric field of exposure light on the mask, and light intensity on a wafer in using a conventional photomask, with reference to FIGS. 44A, 44B, 44C.

First, the cross sectional structure of the mask will be described with reference to FIG. 44A. A metal mask pattern 2 of chromium or the like is formed on a glass substrate 1.

Referring to FIG. 44B, an electric field is generated along the mask pattern. Referring to FIG. 44C however, light beams passing through the mask intensify each other at an overlaid portion of the light beams caused by light diffraction and interference. Consequently, the difference in the light intensity on the wafer becomes smaller, so that the resolution is deteriorated.

A phase shift exposure method with a phase shift mask has been proposed for solving this problem, for example, in Japanese Patent Laying-Open Nos. 57-62052 and 58-173744.

The phase shift exposure method with a phase shift mask disclosed in Japanese Patent Laying-Open No. 58-173744 will now be described with reference to FIGS. 45A, 45B, 45C.

FIG. 45A shows a cross section of the phase shift mask. FIG. 45B shows an electric field on the mask. FIG. 45C shows light intensity on a wafer.

First, referring to FIG. 45A, a phase shifter 6b of a transparent insulation film such as a silicon oxide film is provided at every other aperture portion 6a of a chromium mask pattern 2 formed on a glass substrate 1 to form a phase shift mask.

Referring to FIG. 45B, the electric field of a light beam passing through phase shifter 6b of the phase shift mask is inverted by 180°.

Therefore, the light beams transmitted through aperture portion 6a and through phase shifter 6b cancel each other on an overlaid portion thereof caused by a light interference effect. Consequently, as shown in FIG. 45C, the difference in the light intensity on the wafer is sufficient for enhancing the resolution.

Although the aforementioned phase shift mask is very effective for a periodical pattern such as lines and spaces, it cannot be set to an arbitrary pattern because complexity of the pattern causes great difficulty in arrangement of a phase shifter and the like.

As a phase shift mask solving the above problem, a phase shift mask of attenuation type is disclosed, for example, in *JJAP Series 5 Proc. of* 1991 *Intern. Microprocess Conference* pp. 3–9 and Japanese Patent Laying-Open No. 4-136854. Description will hereinafter be made of the phase shift mask of attenuation type disclosed in Japanese Patent Laying-Open No. 4-136854.

FIG. 46A is a cross section of the phase shift mask of attenuation type. FIG. 46B shows an electric field on the mask. FIG. 46C shows light intensity on a wafer.

Referring to FIG. 46A, the structure of a phase shift mask 100 includes a quartz substrate 1 transmitting exposure light, and a phase shift pattern 30 having a prescribed exposure pattern including a first light transmit portion 10 formed on a main surface of quartz substrate 1 and having the main surface exposed, and a second light transmit portion 20 converting a phase of transmitted exposure light by 180° with respect to the phase of exposure light transmitted through first light transmit portion 10.

Second light transmit portion 20 has a double layer structure including a chromium layer 2 having the transmittance of 5–40% for exposure light, and a shifter layer 3 converting a phase of exposure light transmitted therethrough by 180° with respect to that of exposure light transmitted through light transmit portion 10.

The electric field on the mask, of exposure light passing through phase shift mask 100 having the above-described structure is as shown in FIG. 46B. The light intensity on the wafer has its phase inverted at an edge of the exposure pattern as shown in FIG. 46C.

The light intensity at an edge of the exposure pattern, therefore, is invariably 0, as shown in the figure, so that the difference in the electric field on light transmit portion 10 and phase shifter portion 20 of the exposure pattern is sufficient for high resolution.

It should be noticed that the transmittance of second light transmit portion 20 for exposure light is set to 5–40% in the above method, for the purpose of adjusting the thickness of the resist film after development thereof by the transmittance, as shown in FIG. 31, so as to adapt the exposure amount appropriately for lithography.

Description will now be made of a method of manufacturing phase shift mask 100. FIGS. 48 to 52 are cross sectional views showing the manufacturing steps according to the cross section of phase shift mask 100 shown in FIG. 46A.

Referring to FIG. 48, chromium film 2 having the exposure light transmittance of 5–40% and the thickness of 50–200 Å, approximately, is formed on glass substrate 1. Thereafter, on chromium film 2 formed is $SiO_2$ film 3 of a prescribed thickness having the phase of exposure light passing therethrough converted by 180°. An electron beam resist film 5 is formed on $SiO_2$ film 3.

Referring to FIG. 49, a predetermined portion of electron beam resist film 5 is exposed to electron beams and developed to form a resist 5 having a desired pattern.

Referring to FIG. 50, with resist film 2 as a mask, the $SiO_2$ film is etched using a gas of the $CHF_3$ family. Referring to FIG. 51, chromium film 2 is subjected to wet etching with resist film 5 and $SiO_2$ film 5 as a mask.

Referring to FIG. 52, phase shift mask 100 is completed by removing resist film 5.

In the above conventional technique, however, second light transmit portion 20 has a double layer structure including chromium film 2 for controlling the transmittance and $SiO_2$ film 3 for controlling the phase difference. This structure, therefore, requires devices and process respectively for formation of a chromium film and an $SiO_2$ film.

In addition, the chromium film and the $SiO_2$ film must be etched separately with different etching agents, resulting in numerous steps of the process, and thus leading to higher probabilities of defects and of process errors in the pattern dimension.

Referring to FIG. 53, when a remaining defect (opaque defect) 50 and a pinhole defect (clear defect) 51 should occur in the phase shift mask pattern, repairing methods respectively applicable to a chromium film and an $SiO_2$ film will be required for repairing the defect. A conventional repairing method, therefore, cannot be employed.

Referring to FIG. 54, according to an exposure method using the above-described phase shift mask 100, the film thickness of a second light transmit portion 20 of phase shift mask 100 is approximately 3050 Å to 4200 Å, which is relatively large. Therefore, as shown in the figure, oblique exposure light out of exposure light from an exposure light source has its phase not reliably converted by 180° even if it transmits through second light transmit portion 20 of phase shift mask 100. Exposure light having a different phase is produced.

SUMMARY OF THE INVENTION

One object of the present invention is to simplify manufacturing process of a phase shift mask, so as to provide a phase shift mask of high quality.

Another object of the present invention is to provide a manufacturing method of a phase shift mask having process simplified.

A still another object of the present invention is to provide an exposure method using a phase shift mask, which can prevent exposure failure and improve the yield in the manufacturing steps of a semiconductor device.

In one aspect of the present invention, the phase shift mask includes a substrate transmitting exposure light, and a phase shift pattern formed on a main surface of the substrate. The phase shift pattern includes a first light transmit portion having the substrate exposed, and a second light transmit portion consisting of a single material having a phase of transmitted exposure light converted by 180° with respect to the phase of exposure light transmitted through the first light transmit portion, and having the transmittance of at least 2% and less than 5%.

The second light transmit portion is preferably formed of a single material selected from the group consisting of an oxide of a metal, a nitride oxide of metal, an oxide of a metal silicide and a nitride oxide of a metal silicide.

The second light transmit portion is preferably formed of a single material selected form the group consisting of an oxide of chromium, a nitride oxide of chromium, a carbide nitride oxide of chromium, an oxide of molybdenum silicide and a nitride oxide of molybdenum silicide.

The second light transmit portion is more preferably formed of a single material selected from the group consisting of an oxide chromium, a nitride oxide of chromium and a carbide nitride oxide of chromium.

The second light transmit portion preferably has the transmittance controlled through oxygen or nitrogen included therein, and the phase difference controlled through the thickness thereof.

The exposure method using the phase shift mask according to the present invention includes the following steps.

First, a resist film is applied onto a pattern formation layer. Then, the resist film is exposed using a phase shift mask having a phase shift pattern having a first light transmit portion formed on a substrate transmitting exposure light having the substrate exposed, and a second light transmit portion of a single material having a phase of transmitted exposure light converted by 180° with respect to the phase of exposure light transmitted through the first light transmit portion, and having the transmittance of at least 2% and less than 5%

As a result, it is possible to form a thin second light transmit portion of the thickness of approximately 1500 Å to 2000 Å, and to convert the phase of oblique exposure light by 180°. Therefore, exposure light has its phase uniformed after transmitting through the second light transmit portion of the phase shift mask, making it possible to prevent occurrent of exposure failure. Consequently, the yield can be improved in the manufacturing steps of a semiconductor device.

In accordance with the present invention, the method of manufacturing a phase shift mask includes the following steps.

A phase shifter film of a prescribed thickness having a phase of transmitted exposure light converted by 180°, and having the transmittance of at least 2% and less than 5% is formed on a substrate transmitting exposure light by a sputtering method. A resist film of a prescribed pattern is formed on the phase shifter film.

With the resist film as a mask, the phase shifter film is etched by a dry etching method, so that a first light transmit portion having the substrate exposed and a second light transmit portion formed of the phase shifter film are formed.

The step of forming the phase shifter film preferably includes the step of forming a molybdenum silicide oxide film with a molybdenum silicide target in a mixed gas atmosphere of argon and oxygen.

The mixed gas preferably includes 73–76% argon gas, and an oxygen gas of the remaining percent by volume.

The step of forming the phase shifter film preferably includes the step of forming a molybdenum silicide nitride oxide film with a molybdenum silicide target in a mixed gas atmosphere of an argon gas, an oxygen gas and a nitrogen gas.

The mixed gas preferably includes 57–79% argon gas, 7–18% oxygen gas, and 4–32% nitrogen gas by volume.

The step of forming the phase shifter film preferably includes the step of forming a chromium oxide film with a chromium target in a mixed gas atmosphere of argon and oxygen.

The mixed gas includes 95–96% argon gas, and an oxygen gas of the remaining percent by volume.

The step of forming the phase shifter film preferably includes the step of forming a chromium nitride film with a chromium target in a mixed gas atmosphere of argon, oxygen and nitrogen.

The mixed gas preferably includes 82–83% argon gas, 4–5% oxygen, and 12–13% nitrogen by volume.

The step of forming the phase shifter film preferably includes the step of forming a chromium nitride oxide film with a chromium target in a mixed gas atmosphere of argon and nitrogen monoxide.

The mixed gas includes 75–87% argon gas, and nitrogen monoxide of the remaining percent by volume.

The step of forming the phase shifter film preferably includes the step of forming a chromium carbide nitride oxide film with a chromium target in a mixed gas atmosphere of argon, oxygen and methane.

The mixed gas preferably includes 78–79% argon gas, 12–14% oxygen, and 8–9% methane by volume.

The step of forming the phase shift mask preferably includes the step of forming an antistatic film.

The step of forming the antistatic film preferably includes the step of forming a molybdenum film by a sputtering method between the steps of forming the phase shifter film and forming the resist film.

The step of forming the antistatic film preferably includes the step of forming a chromium film by a sputtering method between the steps of forming the phase shifter film and forming the resist film.

The step of etching the phase shifter film is preferably performed by a dry etching method with a mixed gas of carbon fluoride and oxygen.

The step of etching the phase shifter film is preferably performed by a dry etching method with a gas selected from the group consisting of a mixed gas of methylene chloride and oxygen, a mixed gas of chlorine and oxygen, and a chlorine gas.

The step of forming the phase shifter film preferably includes the step of performing heating process at or above 200° C. after forming the phase shifter film by a sputtering method.

As described above, in the phase shift mask and the manufacturing method thereof in accordance with the present invention, the second light transmit portion is formed of a single material film.

In the manufacturing process of the phase shifter, a film of a prescribed single material is formed on a substrate transmitting exposure light by a sputtering method, and thereafter, a second light transmit portion is formed by prescribed etching.

This enables formation of a phase shift portion with a conventional sputtering device, and also enables etching of a phase shifter portion with a single etching agent.

Consequently, the steps of forming a phase shifter film and etching the same are required only once, respectively, in the manufacturing process, so that probabilities of defects and of process errors in the pattern dimension can be reduced, and thus a phase shift mask of high quality can be provided.

In addition, since a second light transmit portion is formed of a single material film, a defective portion can be readily repaired by a conventional method.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross sectional view of a phase shift mask in a first embodiment according to the present invention.

FIG. 2A is a cross sectional view of a phase shift mask according to the present invention. FIG. 2B is a schematic diagram showing an electric field of exposure light on the mask. FIG. 2C is a schematic diagram showing light intensity on a wafer.

FIG. 39 shows a comparison between the depth of focus of a normal photomask and that of the phase shift mask having the transmittance of 1, 3, 5% based on the data shown in FIG. 38.

FIG. 46A is a cross sectional view of a phase shift mask in a conventional technique. FIG. 46B is a schematic diagram showing an electric field of exposure light on the mask. FIG. 46C is a schematic diagram showing light intensity on a wafer.

DESCRIPTION OF THE PREFERRED EMBODIMENTS

Figure 3:
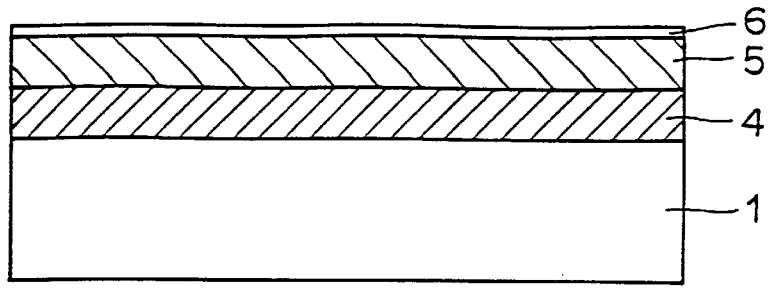
FIGS. 3 to 6 are cross sectional views showing the first to fourth steps of the manufacturing method of the phase shift mask in the first embodiment according to the present invention.

A first embodiment in accordance with the present invention will hereinafter be described.

First, description will be made of the structure of phase shift mask in this embodiment with reference to FIG. 1. A phase shift mask 200 includes a quartz substrate 1 transmitting exposure light, and a phase shift pattern 30 formed on a main surface of quartz substrate 1. Phase shift pattern 30 includes a first light transmit portion 10 having quartz substrate 1 exposed, and a second light transmit portion 4 of a single material having a phase of transmitted exposure light converted by 180° with respect to the phase of exposure light transmitted through first light transmit portion 10, and having the transmittance of 5–40%.

Description will be made of an electric field of exposure light passing therethrough on phase shift mask 200 of the above structure, and light intensity on a wafer with reference to FIGS. 2A, 2B, 2C.

FIG. 2A is a cross sectional view of phase shift mask 200 described above. Referring to FIG. 2B, since the electric field on the mask is inverted at an edge of a exposure pattern, the electric field at the edge portion of the exposure pattern is invariably zero. Accordingly, as shown in FIG. 2c, the difference in the electric field on the wafer at light transmit portion 10 and at phase shift portion 4 of the exposure pattern is sufficient for obtaining higher resolution.

It should be noticed that the transmittance of second light transmit portion 4 is set to 5–40% for the purpose of adjusting the thickness of a resist film after development to adapt appropriately the exposure amount for lithography.

Description will now be made of a manufacturing method of phase shift mask 200 in a second embodiment, employing a molybdenum silicide oxide film or a molybdenum silicide nitride oxide film as a phase shifter film.

FIGS. 3 to 6 are cross sectional views showing the manufacturing process of phase shift mask 200 shown in FIG. 1.

Referring to FIG. 3, on a quartz substrate 1 formed is a phase shifter film 4 of a molybdenum silicide oxide film or a molybdenum silicide nitride oxide film by a sputtering method.

Thereafter, in order to stabilize the transmittance of phase shifter film 4, heating process is performed at or above 200° C. suing a clean oven or the like.

Consequently, fluctuation of the transmittance (0.5–1.0%) conventionally caused by heating process such as resist application process (approximately 180° C.) in formation of a phase shifter film can be prevented.

Subsequently, an electron beam resist film 5 (EP-810S (registered trademark) manufactured by Nihon Zeon) of approximately 5000 Å in thickness is formed on phase shifter film 4. Since the molybdenum silicide oxide film or molybdenum silicide nitride oxide film does not have conductivity, an antistatic film 6 (Espacer 100 (registered trademark) manufactured by Showa Denko) of approximately 100 Å is formed thereon for prevention of being charged in irradiation of electron beams.

Figure 4:
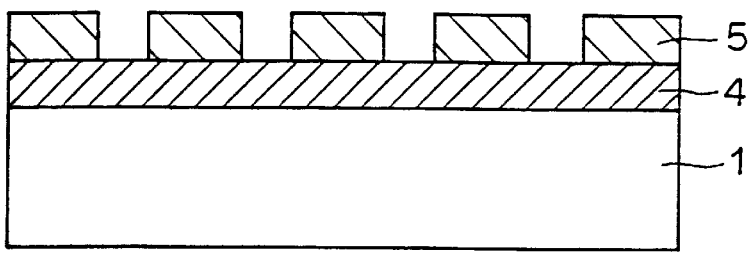

Referring to FIG. 4, electron beam resist film 5 is irradiated with electron beams, and thereafter, antistatic film 6 is washed away with water. Resist film 5 having a prescribed resist pattern is then formed by development of resist film 5.

Figure 5:
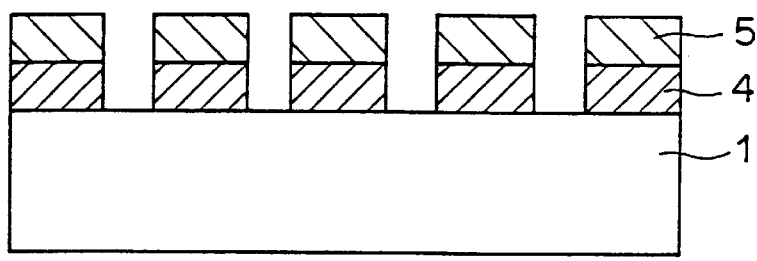

Referring to FIG. 5, phase shifter film 4 is etched with resist film 5 as a mask. At this time, an RF ion etching apparatus of horizontal flat plate type is employed, which performs etching for approximately eleven minutes under the conditions of the electrode-substrate distance of 60 mm, the operating pressure of 0.3 Torr, and the flow rates of reaction gases $CF_4$ and $O_2$ of 95 sccm and 5 sccm, respectively.

Figure 6:
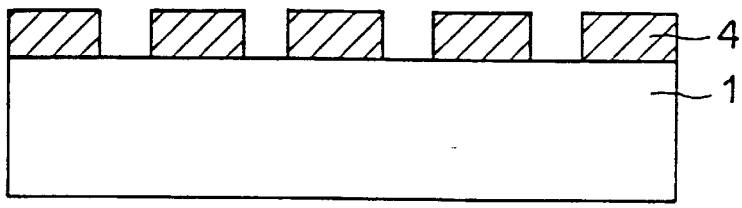

Referring to FIG. 6, resist 5 is removed. Through these steps, the phase shift mask in accordance with the present embodiment is completed.

Formation of the phase shifter film utilizing the above-described sputtering method will hereinafter be described in detail. To have the transmittance for exposure light within the range of 5–40%, and to convert a phase of exposure light by 180° are the requirements for a phase shift film.

As a film satisfying these conditions, therefore, a film made of a molybdenum silicide nitride oxide was employed in the present embodiment.

Description will be made of a sputtering apparatus for forming the aforementioned film with reference to FIG. 7.

Figure 7:
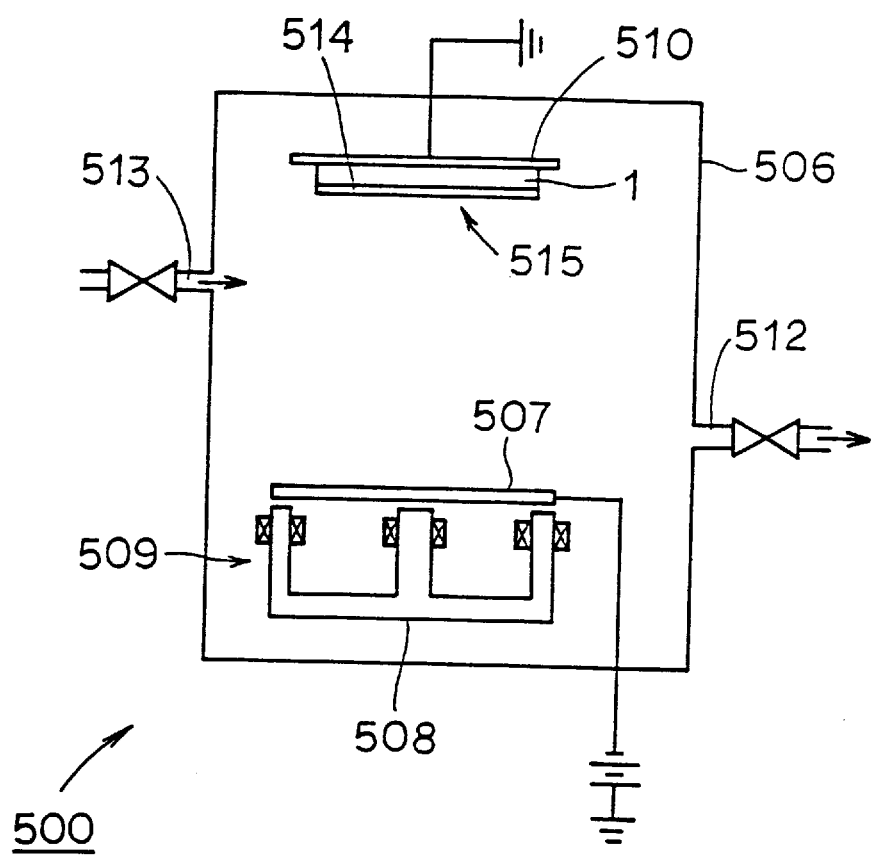
FIG. 7 is a schematic diagram showing the structure of a DC magnetron sputtering apparatus.

FIG. 7 is a schematic diagram showing the structure of a DC magnetron sputtering apparatus 500.

DC magnetron sputtering apparatus 500 includes a vacuum vessel 506 provided with a magnetron cathode 509 including a target 507 and a magnet 508 therein.

An anode 510 is provided opposed to and spaced by a predetermined distance from target 507, on the opposite surface of which from target 507 provided is a quartz substrate 1 of 2.3 mm in thickness and 127 mm square, for example.

An exhaust pipe 512 and a gas feed pipe 513 are provided at predetermined positions of vacuum vessel 506. In formation of a film, molybdenum silicide is used as a target, and the temperature of quartz substrate 1 is held at 60°–150° C. by a heater and a temperature controller, not shown.

Under these conditions, argon as a sputter gas and a mixed gas of oxygen and nitrogen as reaction gas are introduced from gas feed pipe 513 at a prescribed rate, the pressure in vacuum vessel 506 is held at a prescribed value, and a direct current voltage is applied between electrodes.

In this embodiment, phase shifter films of a molybdenum silicide oxide and of a molybdenum silicide nitride oxide were formed in various conditions.

Table 1 shows the pressure in vacuum vessel 506, the deposition rate and the film material in each of the cases in which various flow ratios of the mixed gas are set. A phase shifter film of a molybdenum silicide nitride oxide is to be formed in Cases M-1 to M-7, M-14, and M-15, while a phase shifter film of a molybdenum silicide oxide is to be formed in Cases M-8 to M-13, M-16, and M-17.

Tables 2–4 are graphs showing the transmittance, the n value and the k value in an optical constant (n−i·k), and the film thickness $d_s$ for converting a phase of exposure light by 180°, in the cases employing a krF laser ($\lambda$=248 nm), an i-line ($\lambda$=365 nm) and a g-line ($\lambda$=436 nm) as exposure light, respectively.

In Tables 2–4, the film thickness $d_s$ can be obtained from the following:

$$d_s = \lambda/2(n-1) \quad (2)$$

where $\lambda$ is a wavelength of exposure light, and n is a value in the optical constant.

TABLE 1

| | gas flow ratio % | | | pressure ×10⁻³ | deposition rate | film |
|---|---|---|---|---|---|---|
| case | Ar | O₂ | N₂ | Torr | Å/min | material |
| M-1 | 72.6 | 23.8 | 3.6 | 2.0 | 709 | MoSi |
| M-2 | 77.1 | 18.3 | 4.6 | 2.0 | 645 | nitride |
| M-3 | 72.1 | 8.6 | 19.3 | 2.0 | 600 | oxide |
| M-4 | 68.6 | 7.9 | 23.5 | 2.1 | 525 | film |
| M-5 | 61.4 | 7.0 | 31.6 | 2.1 | 486 | |
| M-6 | 57.4 | 13.1 | 29.5 | 2.2 | 522 | |

TABLE 1-continued

| | gas flow ratio % | | | pressure ×10⁻³ | deposition rate | film |
|---|---|---|---|---|---|---|
| case | Ar | O₂ | N₂ | Torr | Å/min | material |
| M-7 | 65.4 | 17.8 | 16.8 | 2.0 | 578 | |
| M-8 | 79.5 | 20.5 | 0 | 2.0 | 635 | MoSi |
| M-9 | 73.3 | 26.7 | 0 | 2.0 | 600 | oxide |
| M-10 | 78.8 | 21.2 | 0 | 2.6 | 225 | film |
| M-11 | 81.1 | 18.9 | 0 | 2.6 | 632 | |
| M-12 | 82.3 | 17.7 | 0 | 2.6 | 650 | |
| M-13 | 83.5 | 16.5 | 0 | 2.6 | 754 | |
| M-14 | 73.4 | 14.9 | 11.7 | 3.0 | 702 | MoSi |
| M-15 | 79.0 | 16.8 | 4.2 | 2.8 | 750 | nitride oxide film |
| M-16 | 76.0 | 24.0 | 0 | 2.6 | 830 | MoSi |
| M-17 | 92.0 | 8.0 | 0 | 5.5 | 487 | oxide film |

TABLE 2 krF laser (wavelength 248 nm)

| | transmittance | optical constant | | $d_3 = \dfrac{2480}{2(n-1)}$ |
|---|---|---|---|---|
| case | % | n | k | Å |
| M-1 | 5.22 | 1.195 | 0.409 | 1355 |
| M-2 | 3.59 | 1.860 | 0.437 | 1442 |
| M-3 | 2.92 | 1.986 | 0.530 | 1258 |
| M-4 | 0.69 | 2.14 | 0.868 | 1088 |
| M-5 | 0.74 | 2.09 | 0.821 | 1137 |
| M-6 | 1.8 | 1.922 | 0.569 | 1345 |
| M-7 | 2.6 | 1.963 | 0.538 | 1288 |
| M-8 | 7.0 | 1.79 | 0.318 | 1570 |
| M-9 | 4.6 | 1.68 | 0.322 | 1824 |
| M-10 | 10.2 | 1.730 | 0.251 | 1700 |
| M-11 | 5.0 | 1.76 | 0.350 | 1630 |
| M-12 | 6.13 | 1.91 | 0.384 | 1360 |
| M-13 | 5.51 | 1.90 | 0.394 | 1380 |
| M-14 | 3.52 | 2.054 | 0.5325 | 1176 |
| M-15 | 3.03 | 2.111 | 0.5855 | 1116 |
| M-16 | 4.39 | 1.804 | 0.3844 | 1541 |
| M-17 | 6.88 | 1.842 | 0.3409 | 1472 |

TABLE 3 i-line (wavelength 365 nm)

| | transmittance | optical constant | | $d_3 = \dfrac{3850}{2(n-1)}$ |
|---|---|---|---|---|
| case | % | n | k | Å |
| M-1 | 11.6 | 1.874 | 0.280 | 2088 |
| M-2 | 11.5 | 1.950 | 0.304 | 1921 |
| M-3 | 8.82 | 2.11 | 0.397 | 1644 |
| M-4 | 2.9 | 2.318 | 0.697 | 1382 |
| M-5 | 4.15 | 2.344 | 0.626 | 1362 |
| M-6 | 3.5 | 2.01 | 0.511 | 1807 |
| M-7 | 4.53 | 1.88 | 0.414 | 2074 |
| M-8 | 44.5 | 2.11 | 0.118 | 1644 |
| M-9 | 78.6 | 1.85 | 0.0169 | 2147 |
| M-10 | 73.8 | 1.77 | 0.020 | 2370 |
| M-11 | 18.7 | 1.91 | 0.222 | 2005 |
| M-12 | 12.2 | 1.81 | 0.254 | 2250 |
| M-13 | 17.9 | 1.98 | 0.245 | 1860 |
| M-14 | 8.55 | 2.068 | 0.389 | 1709 |
| M-15 | 8.71 | 2.189 | 0.420 | 1535 |
| M-16 | 9.39 | 1.707 | 0.2536 | 2581 |
| M-17 | 16.5 | 1.833 | 0.2207 | 2192 |

TABLE 4

| | g-line (wavelength 436 nm) | | | |
|---|---|---|---|---|
| | transmittance | optical constant | | $d_3 = \frac{4380}{2(n-1)}$ |
| case | % | n | k | Å |
| M-1 | 12.0 | 1.786 | 0.249 | 2774 |
| M-2 | 16.4 | 2.006 | 0.265 | 2167 |
| M-3 | 11.7 | 2.148 | 0.358 | 1900 |
| M-4 | 3.9 | 2.346 | 0.644 | 1620 |
| M-5 | 3.4 | 2.121 | 0.572 | 1945 |
| M-6 | 4.4 | 1.860 | 0.410 | 2535 |
| M-7 | 8.8 | 2.018 | 0.367 | 2141 |
| M-8 | 46.3 | 2.197 | 0.114 | 1821 |
| M-9 | 83.0 | 1.795 | 0.0069 | 2742 |
| M-10 | 78.0 | 1.733 | 0.0123 | 2974 |
| M-11 | 22.2 | 1.901 | 0.195 | 2420 |
| M-12 | 21.1 | 1.982 | 0.220 | 2220 |
| M-13 | 13.3 | 1.702 | 0.213 | 3105 |
| M-14 | 13.0 | 2.124 | 0.3325 | 1940 |
| M-15 | 11.9 | 2.185 | 0.3653 | 1840 |
| M-16 | 17.9 | 1.886 | 0.222 | 2460 |
| M-17 | 18.2 | 1.775 | 0.1934 | 2812 |

Figure 8:
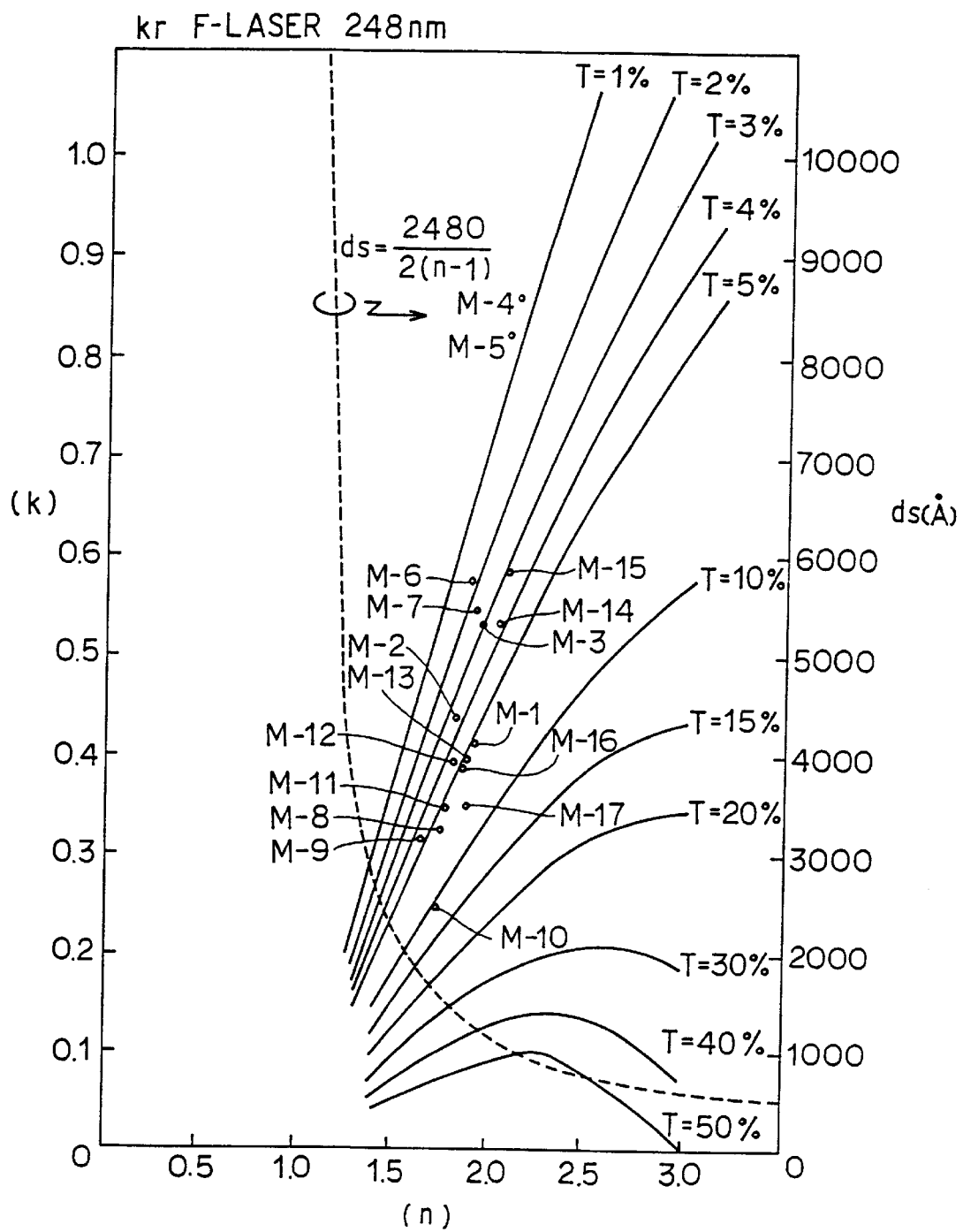
FIG. 8 is a graph showing the relation of n value, k value and a film thickness in using a krF laser.
Figure 9:
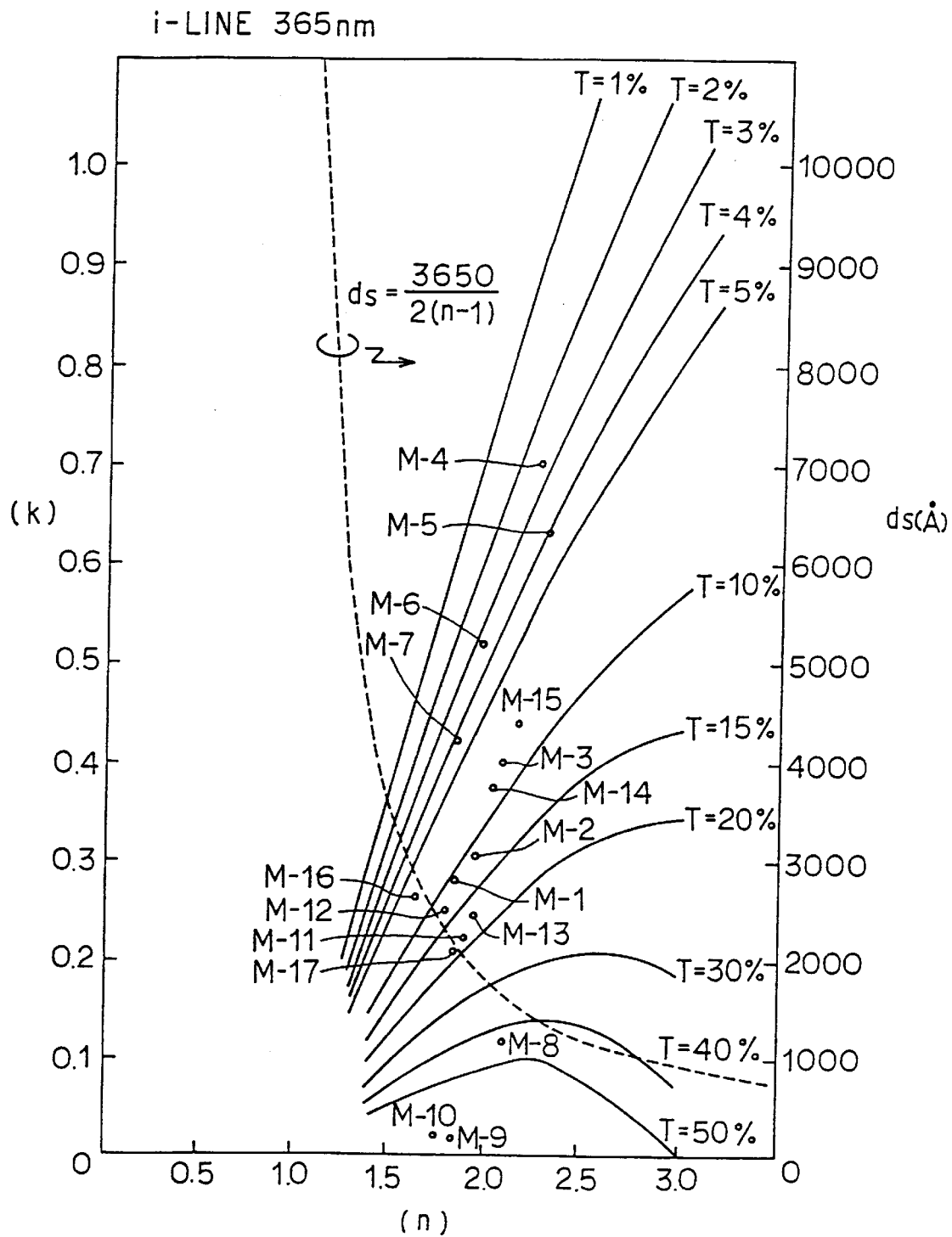
FIG. 9 is a graph showing the relation of n value, k value and a film thickness in using an i-line.
Figure 10:
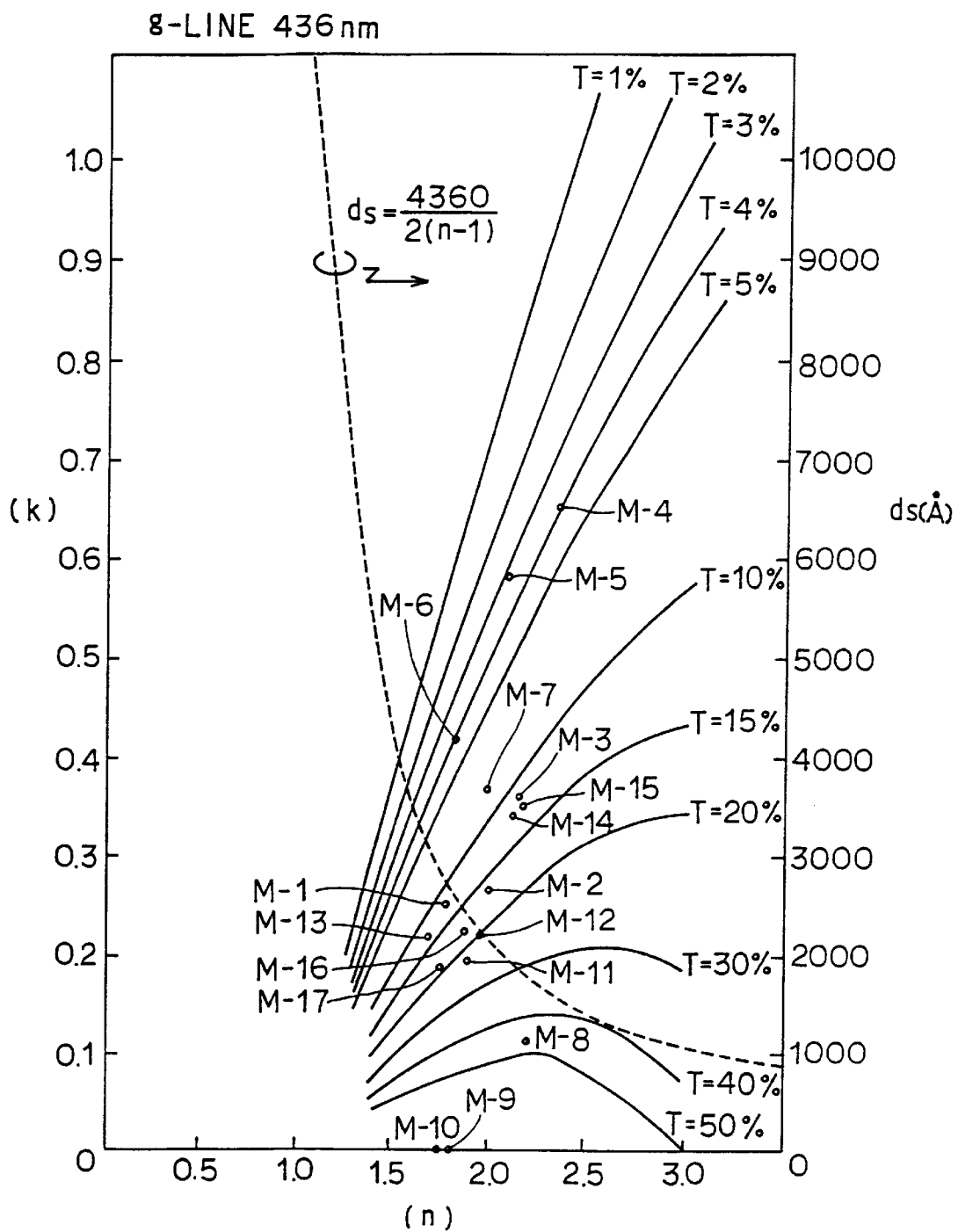
FIG. 10 is a graph showing the relation of n value, k value and a film thickness in using a g-line.

FIGS. 8 to 10 are graphs of data shown in Table 2 to 4, respectively, in which the horizontal axis indicates the n value in the optical constant, the left vertical axis indicates the k value in the optical constant, and the right vertical axis indicates the film thickness $d_s$.

The transmittance T is also shown in FIGS. 8 to 10.

Referring to FIG. 8 showing the cases of exposure light of the krF laser, it can be seen that the transmittance T within the range of 5–40% required for a phase shifter film is obtained in M-1, M-8, M-10 to M-13, and M-17.

Referring to FIG. 9 showing the cases of exposure light of the i-line, the transmittance T within the range of 5–40% required for a phase shift mask is obtained in M-1 to M-3, M-8, and M-11 to M-17.

Referring to FIG. 10 showing the cases of exposure light of the g-line, it can be seen that the transmittance T within the range of 5–40% required for a phase shifter film is obtained in M-1 to M-3, M-7, and M-11 to M-17.

As a result, the films formed in M-1 to M-3, M-7, M-8, and M-10 to M-17 can be employed as a phase shifter film.

Figure 11:
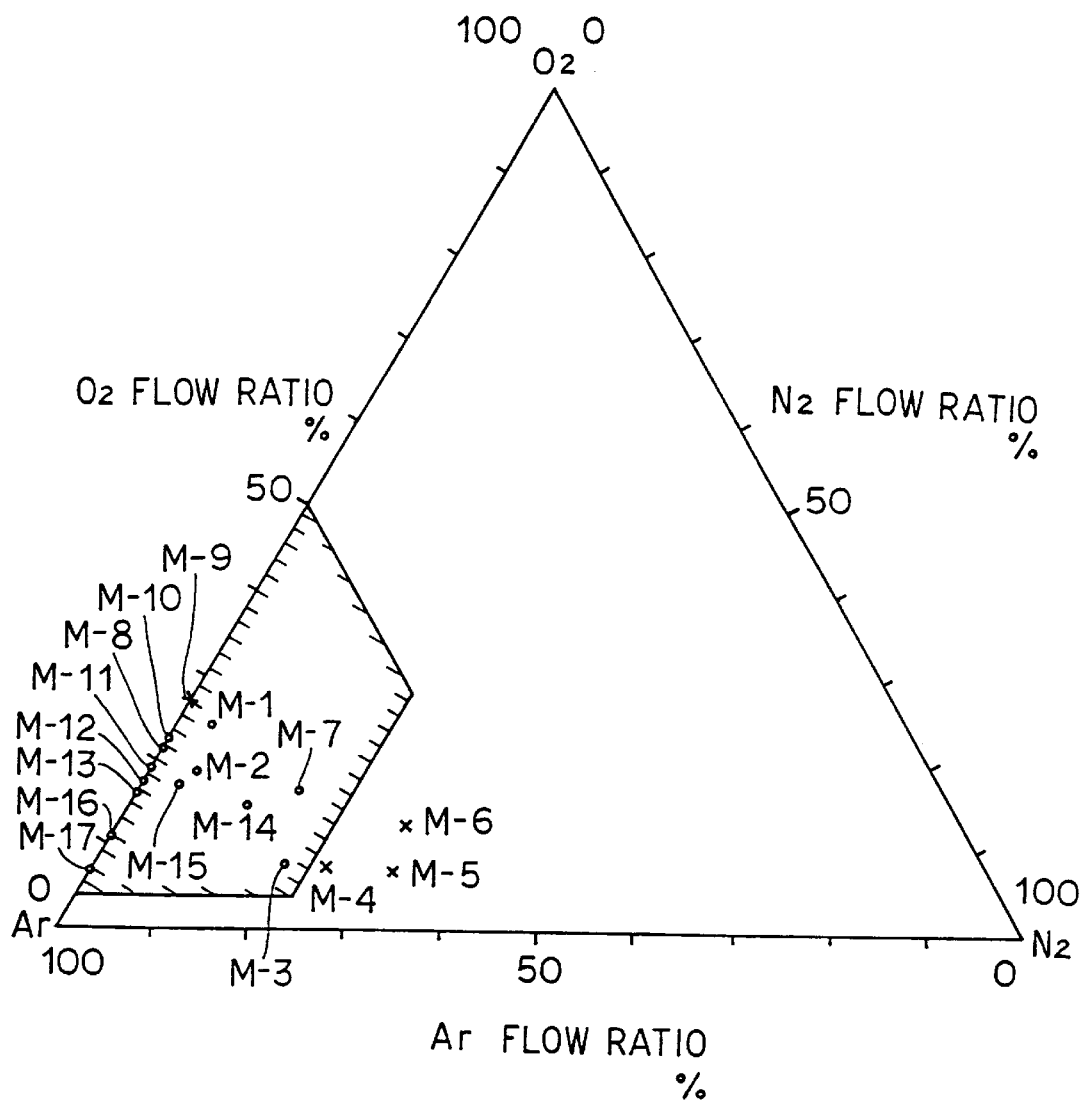
FIG. 11 is a plot showing case by case a flow ratio of a mixed gas in formation of the phase shifter film in the first embodiment.

FIG. 11 is a graph showing the above cases with respect to gas flow ratios. In the graph shown in FIG. 11, respective rates of argon, oxygen and nitrogen in Cases M-1 to M-17 are described.

In this graph, a point of a mixed gas in each case is plotted, wherein the base of the triangle indicates the flow ratio (%) of argon, the left oblique side thereof indicates the flow ratio (%) of oxygen, and the right oblique side thereof indicates the flow ratio (%) of nitrogen. In accordance with the result shown in FIGS. 8 to 10, a case the film of which is applicable as a phase shifter film is indicated by a circle, while a case the film of which is not applicable to a phase shifter film is indicated by a cross.

As can be seen from the graph in FIG. 11, a mixed gas for forming a molybdenum silicide oxide film applicable as a phase shifter film includes 76–92% argon and 8–24% oxygen by volume.

A mixed gas for forming a molybdenum silicon nitride oxide film applicable as a phase shifter film includes 65–79% argon, 8–24% oxygen, and 3–20% nitrogen by volume.

The upper limit of oxygen is set to 35%, because the rate occupied by oxygen of 50% or more will cause deposition of an oxide on an electrode in the sputtering apparatus, thereby preventing sputtering. It is thus defined by the restriction of the apparatus.

As described above, in the phase shift mask in accordance with the present invention, a second light transmit portion is constituted only of a molybdenum silicide oxide film or a molybdenum silicide nitride oxide film having the transmittance of 4–50%.

In the manufacturing process thereof, a molybdenum silicon oxide or a molybdenum silicide nitride oxide is formed to a prescribed film thickness by a sputtering method, and thereafter, a prescribed etching is performed, whereby the second light transmit portion is formed.

Consequently, a phase shifter film can be formed with a conventional sputtering apparatus, and additionally, probabilities of defects and errors in a pattern dimension can be reduced because etching process is required only once.

Description will hereinafter be made of a method of manufacturing phase shift mask 200 in accordance with a third embodiment, where either of a chromium oxide film, a chromium nitride oxide film, and a chromium carbide nitride oxide film is employed as a phase shifter film.

FIGS. 12 to 15 are cross sectional views showing the manufacturing steps of phase shift mask 200 shown in FIG. 1.

Figure 12:
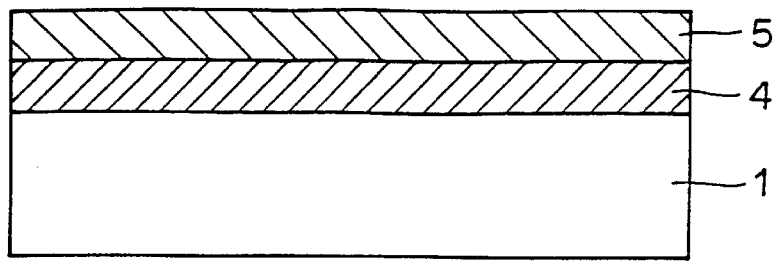
FIGS. 12 to 15 are cross sectional views showing the first to fourth steps of the manufacturing method of a phase shift mask in a second embodiment according to the present invention.

Referring to FIG. 12, phase shifter film 4 of a chromium oxide film, a chromium nitride oxide film, or a chromium carbide nitride oxide is formed on quartz substrate 1 by a sputtering method.

In order to stabilize the transmittance of phase shifter film 4, heating process is performed at approximately 200° C. or more with a clean oven or the like.

This prevents fluctuation of the transmittance (0.5–1.0%) cause by conventional heating processing (approximately 180° C.) in resist application process after phase shifter film formation.

Subsequently, a resist film 5 of approximately 5000 Å in thickness is formed on phase shifter film 4.

Figure 13:
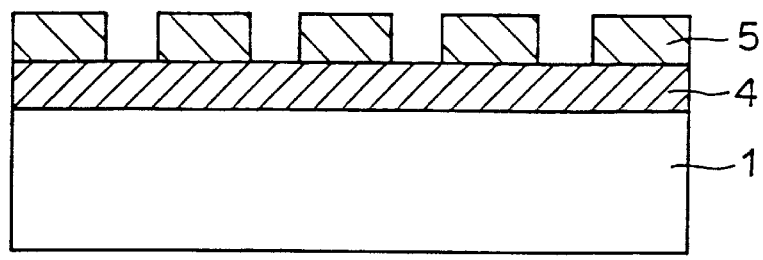

Referring to FIG. 13, resist film 5 is irradiated with an i-line and developed so as to have a prescribed resist pattern.

Figure 14:
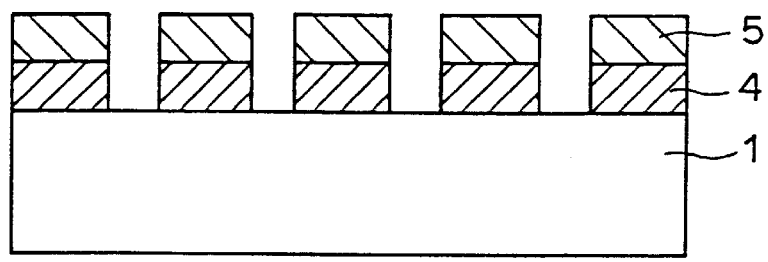
Figure 15:
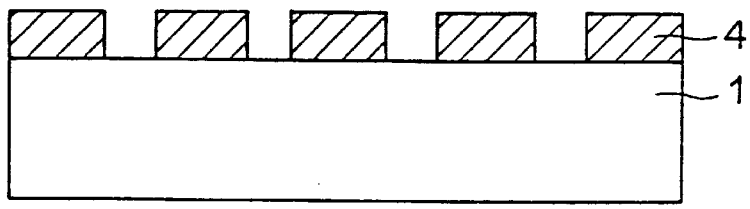

Referring to FIG. 14, phase shifter film 4 is etched with resist film 5 as a mask. At this time, an RF ion etching apparatus of horizontal flat plate type is employed, in which etching is performed for approximately four minutes under the conditions of the electrode-substrate distance of 100 mm, the operating pressure of 0.3 Torr, the flow rates of reaction gases $CH_2Cl_2$ and $O_2$ of 25 sccm and 75 sccm, respectively. The phase shift mask in accordance with the present embodiment is thus completed.

Detailed description will now be made of formation of the phase shift mask utilizing the sputtering method described above. To have the transmittance within the range of 5–40% for exposure light, and to convert of a phase of exposure light by 180° are the requirements for a phase shifter film.

As a film satisfying these conditions, therefore, a film made of a chromium oxide, a chromium nitride oxide, or a chromium carbide oxide nitride is employed in the present embodiment.

The structure of the sputtering apparatus for forming the above phase shifter film is the same as that shown in FIG. 7, and the description thereof is not repeated.

In the present embodiment, phase shift masks of a chromium oxide film, a chromium nitride oxide film, and a chromium carbide nitride oxide film were formed in various cases.

Table 5 shows the pressure in vacuum vessel, the deposition rate and the film material in each of the cases in which various flow ratios of a mixed gas are set. A phase shifter film of a chromium oxide is to be formed in Cases C-1 to C-13, a phase shifter film of a chromium nitride oxide is to be formed in Cases C-14 to C-26, and a phase shifter film of a chromium carbide nitride oxide is to be formed in Cases C-27 to C-30.

Tables 6 to 8 are graphs showing the transmittance, the n value and the k value in the optical constant (n−i·k), and the film thickness $d_s$ for converting a phase of exposure light by 180° in the cases employing a krF laser ($\lambda$=248 nm), an i-line ($\lambda$=365 nm) and a g-line ($\lambda$=436 nm), respectively.

In Tables 6 to 8, the film thickness $d_s$ can be obtained from the following:

$$d_s = \lambda/2(n-1) \quad (2)$$

where $\lambda$ is a wavelength of exposure light, and n is a value in the optical constant.

TABLE 5

| case | gas flow ratio % Ar | O₂ | N₂ | NO | CH₄ | pressure ×10⁻³ Torr | deposition rate Å/min | film material |
|---|---|---|---|---|---|---|---|---|
| C-1 | 71.4 | 28.6 | 0 | 0 | 0 | 3.0 | 259 | Cr oxide film |
| C-2 | 92.3 | 7.7 | 0 | 0 | 0 | 3.9 | 850 | |
| C-3 | 90.0 | 10.0 | 0 | 0 | 0 | 3.0 | 900 | |
| C-4 | 85.0 | 15.0 | 0 | 0 | 0 | 2.0 | 941 | |
| C-5 | 85.5 | 14.5 | 0 | 0 | 0 | 6.1 | 796 | |
| C-6 | 89.3 | 10.7 | 0 | 0 | 0 | 8.0 | 828 | |
| C-7 | 92.7 | 7.3 | 0 | 0 | 0 | 4.0 | 758 | |
| C-8 | 96.6 | 3.4 | 0 | 0 | 0 | 4.0 | 448 | |
| C-9 | 94.8 | 5.2 | 0 | 0 | 0 | 8.1 | 733 | |
| C-10 | 93.1 | 6.9 | 0 | 0 | 0 | 6.1 | 791 | |
| C-11 | 90.2 | 9.81 | 0 | 0 | 0 | 4.0 | 824 | |
| C-12 | 90.1 | 9.93 | 0 | 0 | 0 | 4.1 | 787 | |
| C-13 | 95.1 | 4.92 | 0 | 0 | 0 | 8.2 | 659 | |
| C-14 | 54.1 | 32.4 | 13.5 | 0 | 0 | 1.5 | 110 | Cr nitride oxide film |
| C-15 | 48.8 | 39.0 | 12.2 | 0 | 0 | 1.5 | 108 | |
| C-16 | 87.2 | 6.4 | 6.4 | 0 | 0 | 4.1 | 592 | |
| C-17 | 82.9 | 4.9 | 12.2 | 0 | 0 | 4.2 | 523 | |
| C-18 | 90.0 | 1.3 | 8.7 | 0 | 0 | 4.1 | 756 | |
| C-19 | 76.0 | 0 | 0 | 24.0 | 0 | 2.0 | 600 | |
| C-20 | 83.0 | 0 | 0 | 17.0 | 0 | 3.2 | 620 | |
| C-21 | 75.5 | 0 | 0 | 24.5 | 0 | 2.3 | 570 | |
| C-22 | 86.0 | 0 | 0 | 14.0 | 0 | 4.2 | 550 | |
| C-23 | 86.5 | 0 | 0 | 13.5 | 0 | 4.1 | 580 | |
| C-24 | 82.4 | 0 | 0 | 17.6 | 0 | 3.2 | 520 | |
| C-25 | 86.2 | 0 | 0 | 13.8 | 0 | 4.2 | 129 | |
| C-26 | 87.1 | 0 | 0 | 12.9 | 0 | 4.1 | 675 | |
| C-27 | 85.2 | 5.3 | 0 | 0 | 9.5 | 4.0 | 471 | Cr carbide nitride oxide film |
| C-28 | 82.9 | 7.9 | 0 | 0 | 9.2 | 3.0 | 513 | |
| C-29 | 78.3 | 13.0 | 0 | 0 | 8.7 | 2.0 | 642 | |
| C-30 | 87.9 | 2.3 | 0 | 0 | 9.8 | 8.1 | 399 | |

TABLE 6 krF laser (wavelength 248 nm)

| case | transmittance % | optical constant n | k | $d_s \frac{2480}{2(n-1)}$ Å |
|---|---|---|---|---|
| C-1 | 8.9 | 2.782 | 0.5696 | 696 |
| C-13 | 3.50 | 2.538 | 0.7448 | 806.2 |
| C-25 | 3.80 | 2.565 | 0.7347 | 792 |

TABLE 7 i-line (wavelength 365 nm)

| case | transmittance % | optical constant n | k | $d_s \frac{3850}{2(n-1)}$ Å |
|---|---|---|---|---|
| C-1 | 31.7 | 2.23 | 0.187 | 1484 |
| C-2 | 8.95 | 2.529 | 0.5108 | 1194 |
| C-3 | 6.08 | 2.355 | 0.5495 | 1347 |
| C-4 | 6.52 | 2.481 | 0.5749 | 1212 |
| C-5 | 5.81 | 2.258 | 0.5252 | 1451 |
| C-6 | 5.64 | 2.272 | 0.5364 | 1435 |
| C-7 | 6.18 | 2.275 | 0.5186 | 1432 |
| C-8 | 6.22 | 2.225 | 0.5000 | 1490 |
| C-9 | 12.9 | 2.513 | 0.4171 | 1238 |
| C-10 | 8.52 | 2.296 | 1.4603 | 1408 |
| C-11 | 6.63 | 2.238 | 0.4922 | 1474 |
| C-12 | 7.23 | 2.299 | 0.8949 | 1405 |
| C-13 | 11.3 | 2.579 | 0.4634 | 1159 |
| C-14 | 9.79 | 2.44 | 0.468 | 1267 |
| C-15 | 10.0 | 2.50 | 0.476 | 1217 |
| C-16 | 5.35 | 2.527 | 0.6365 | 1195 |
| C-17 | 4.65 | 2.494 | 0.6588 | 1222 |
| C-18 | 8.78 | 2.632 | 0.5399 | 1118 |
| C-19 | 0.199 | 2.142 | 1.098 | 1598 |
| C-20 | 0.543 | 2.283 | 1.089 | 1250 |
| C-21 | 1.42 | 2.316 | 0.8407 | 1387 |
| C-22 | 1.60 | 2.346 | 0.8336 | 1100 |
| C-23 | 0.102 | 2.290 | 1.3672 | 1415 |
| C-24 | 1.38 | 2.413 | 0.9021 | 1100 |
| C-25 | 12.1 | 2.471 | 0.4257 | 1241 |
| C-26 | 1.80 | 2.505 | 0.8904 | 1213 |
| C-27 | 6.18 | 2.530 | 0.6010 | 1196 |
| C-28 | 5.06 | 2.283 | 0.5625 | 1422 |
| C-29 | 3.47 | 2.440 | 0.7066 | 1267 |
| C-30 | 8.65 | 2.413 | 0.4894 | 1291 |

TABLE 8 g-line (wavelength 436 nm)

| case | transmittance % | optical constant n | k | $d_s \frac{4360}{2(n-1)}$ Å |
|---|---|---|---|---|
| C-2 | 19.58 | 2.660 | 0.3262 | 1313 |
| C-3 | 14.2 | 2.365 | 0.3689 | 1597 |
| C-4 | 11.1 | 2.285 | 0.4029 | 1696 |
| C-5 | 17.3 | 2.595 | 0.3495 | 1411 |
| C-6 | 16.1 | 2.538 | 0.3669 | 1417 |
| C-7 | 19.73 | 2.629 | 0.3220 | 1338 |
| C-8 | 21.9 | 2.630 | 0.2936 | 1537 |
| C-9 | 27.1 | 2.590 | 0.2343 | 1371 |
| C-10 | 25.3 | 2.900 | 0.2514 | 1147 |
| C-11 | 21.2 | 2.539 | 0.297 | 1416 |
| C-12 | 20.8 | 2.617 | 0.3062 | 1348 |
| C-13 | 23.4 | 2.676 | 0.2760 | 1301 |
| C-16 | 14.4 | 2.786 | 0.4263 | 1221 |
| C-17 | 12.5 | 2.732 | 0.4621 | 1258 |
| C-18 | 9.94 | 2.053 | 0.3587 | 2070 |
| C-19 | 1.93 | 2.607 | 0.925 | 1356 |
| C-21 | 2.84 | 2.706 | 0.8715 | 1270 |
| C-22 | 6.13 | 2.706 | 0.6562 | 1280 |
| C-23 | 3.60 | 2.631 | 0.7820 | 1320 |
| C-24 | 5.02 | 2.748 | 0.7250 | 1250 |
| C-26 | 3.98 | 2.630 | 0.7475 | 1337 |
| C-27 | 1.29 | 1.731 | 0.4952 | 2982 |
| C-28 | 14.5 | 2.482 | 0.3834 | 1471 |
| C-29 | 5.50 | 2.335 | 0.5641 | 1633 |
| C-30 | 18.8 | 2.580 | 0.3304 | 1380 |

Figure 16:
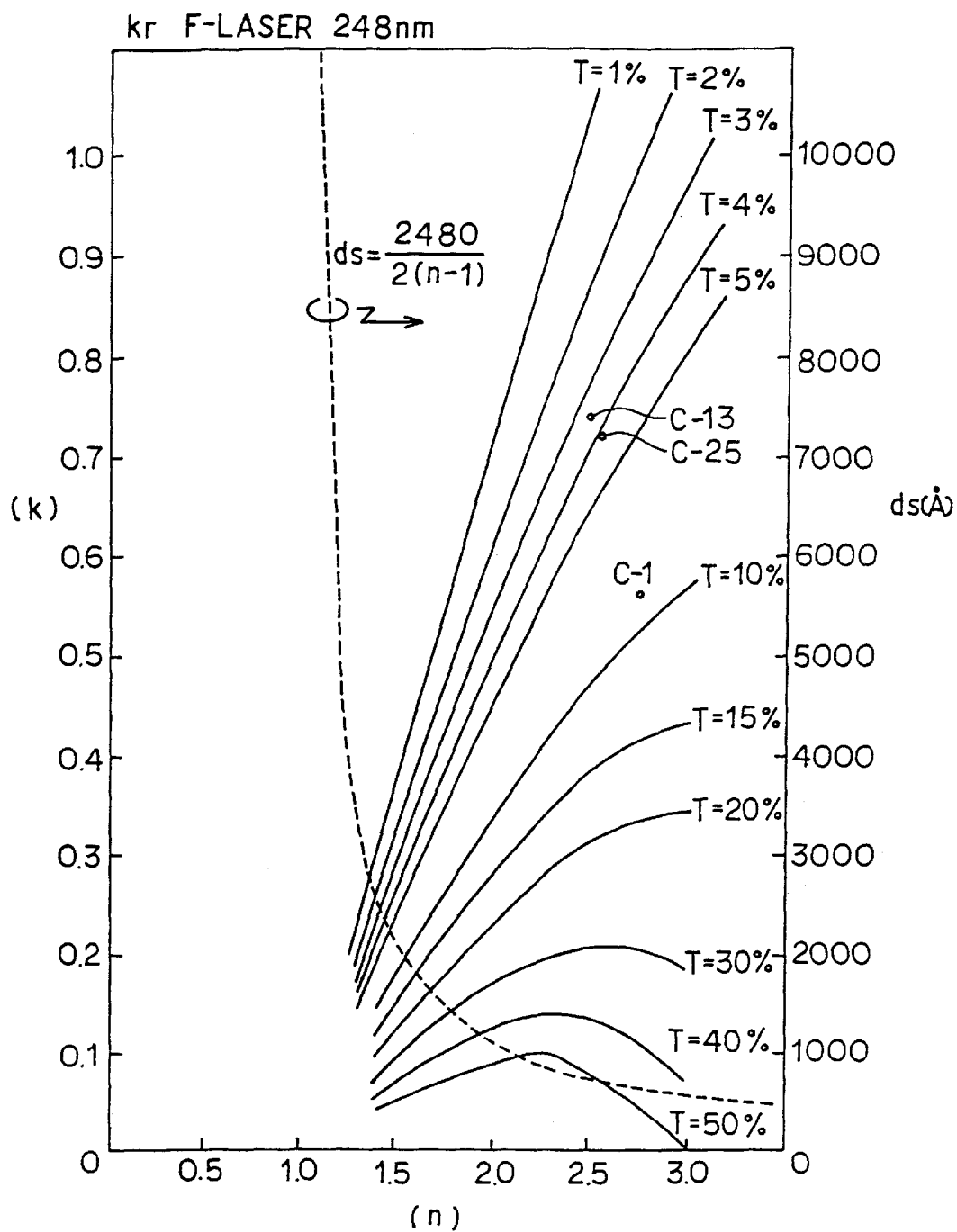
FIG. 16 is a graph showing the relation of n value, k value and a film thickness in using KrF laser.
Figure 17:
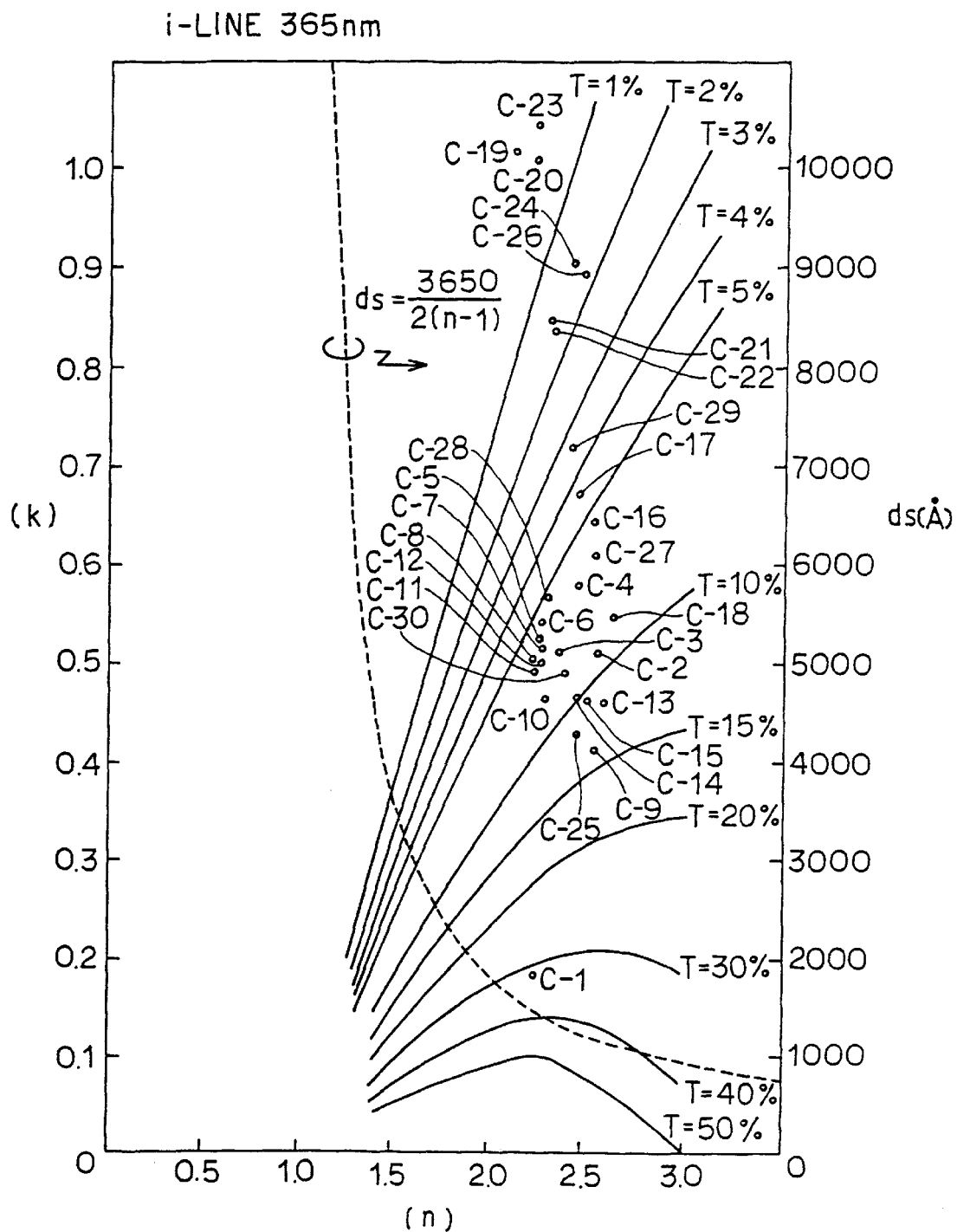
FIG. 17 is a graph showing the relation of n value, k value and a film thickness in using an i-line.
Figure 18:
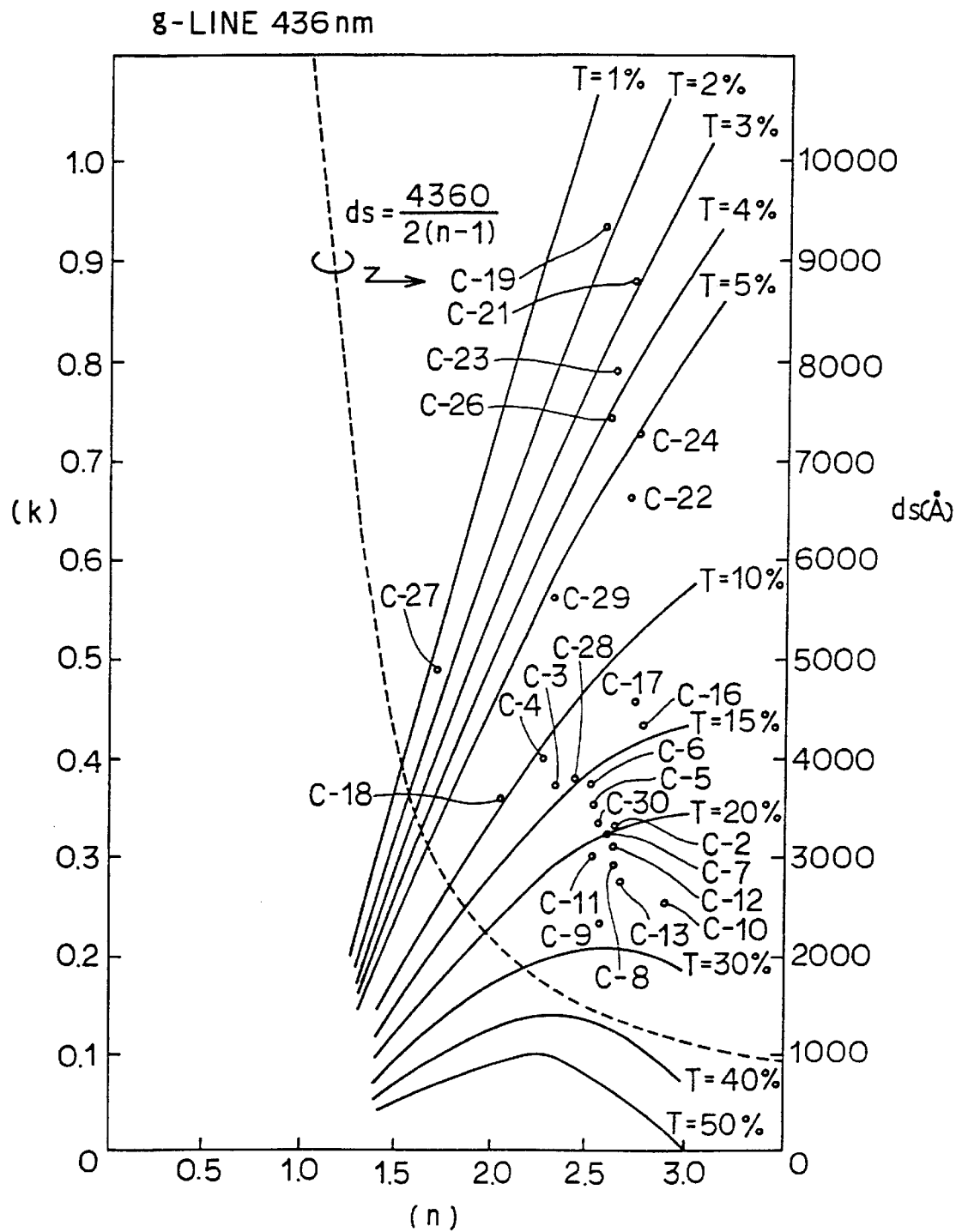
FIG. 18 is a graph showing the relation of n value, k value and a film thickness in using a g-line.

FIGS. 16, 17 and 18 are graphs of data shown in Tables 6, 7 and 8. The horizontal axis indicates the n value in the optical constant, the left vertical axis indicates the k value in the optical constant, and the right vertical axis indicates the film thickness $d_s$.

The transmittance T is also shown in FIGS. 16, 17 and 18.

Referring to FIG. 17 showing the case of exposure light of the i-line, it can be seen that the transmittance T within the range of 5–40% required for a phase shift mask is obtained in C-1 to C-16, C-18, C-25, C-27, C-28, and C-30.

Referring to FIG. 18 showing the case of exposure light of the g-line, it can be seen that the transmittance T within the range of 5–40% required for a phase shift mask is obtained in Cases C-2 to C-13, C-16 to C-18, C-22, C-24, and C-28 to C-30.

As a result, the films formed in Cases C-1 to C-18, C-22, C-24, C-25, and C-27 to C-30 can be employed as a phase shifter film.

Figure 19:
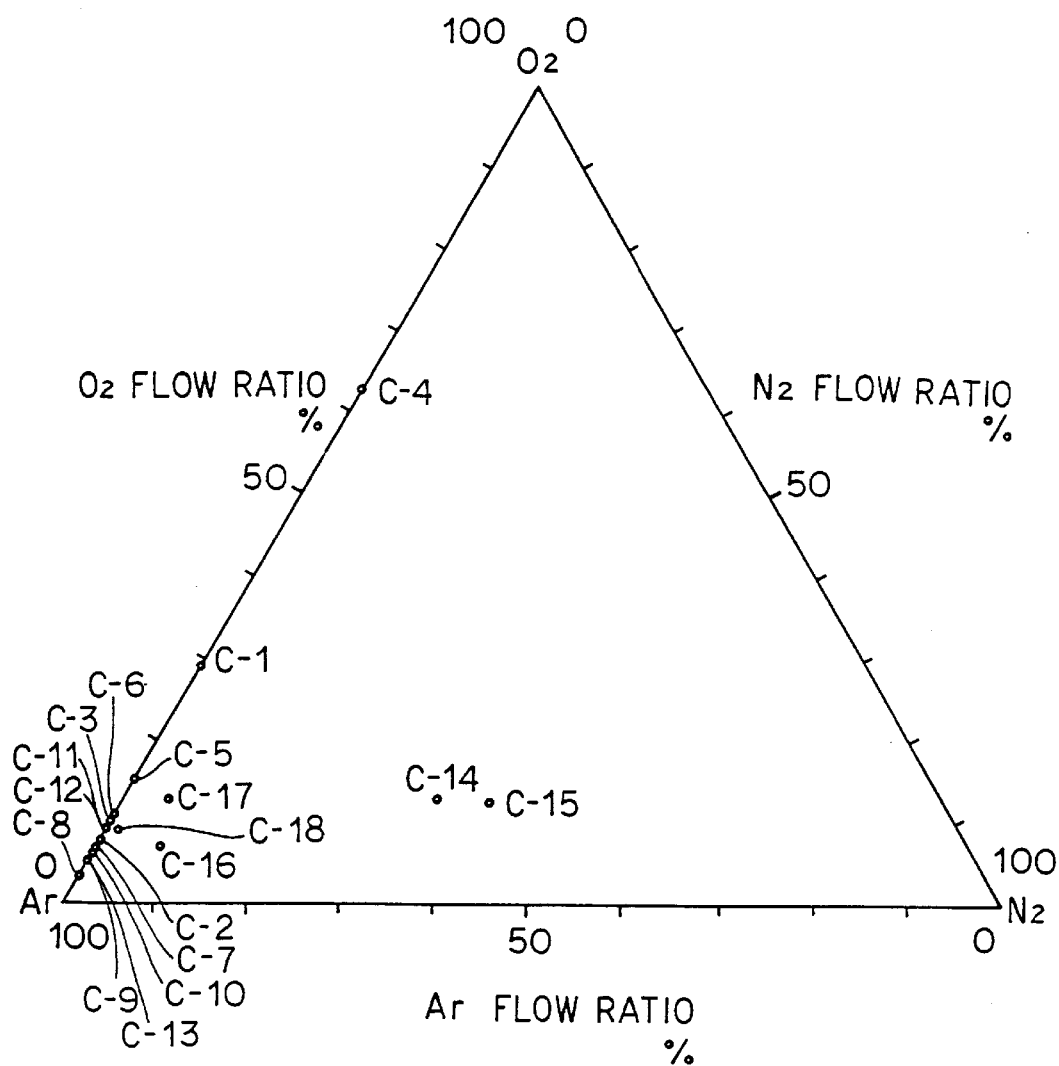
FIG. 19 is a first diagram plotting case by case a flow ratio of a mixed gas in formation of the phase shifter film in the second embodiment.
Figure 20:
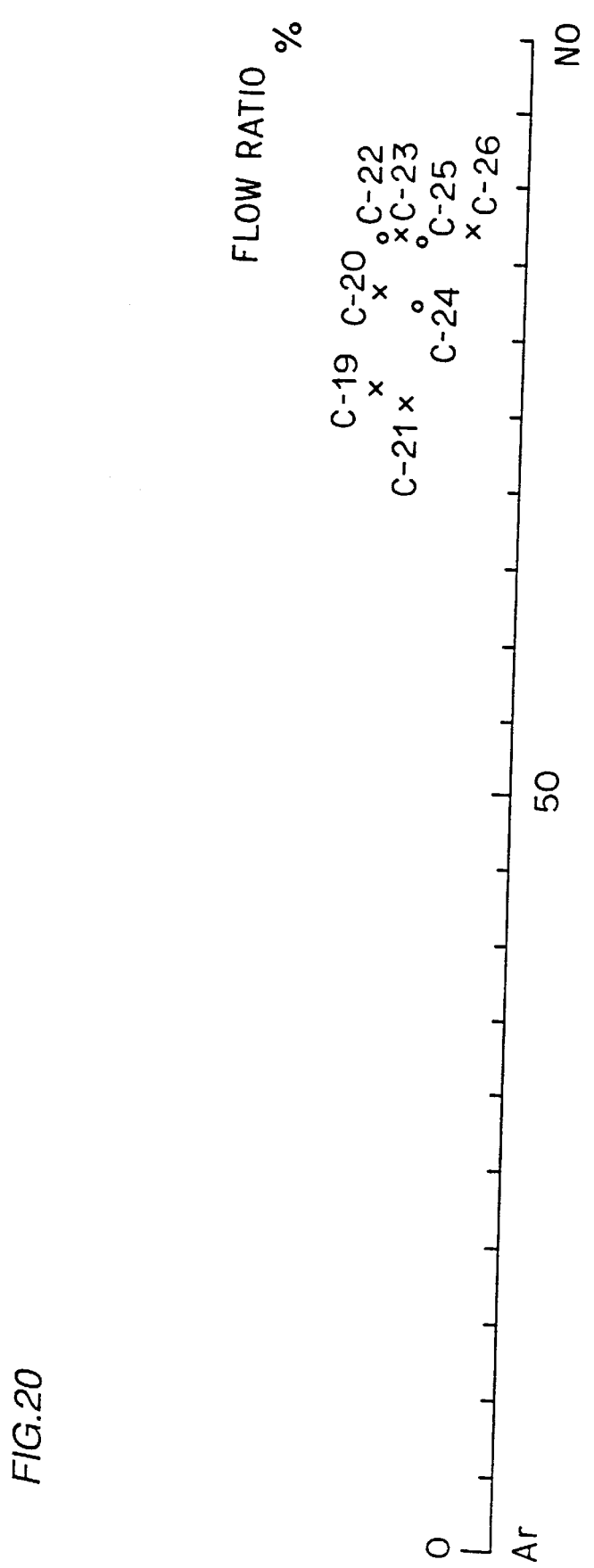
FIG. 20 is a second diagram plotting case by case a flow ratio of a mixed gas in formation of the phase shifter film in the second embodiment.
Figure 21:
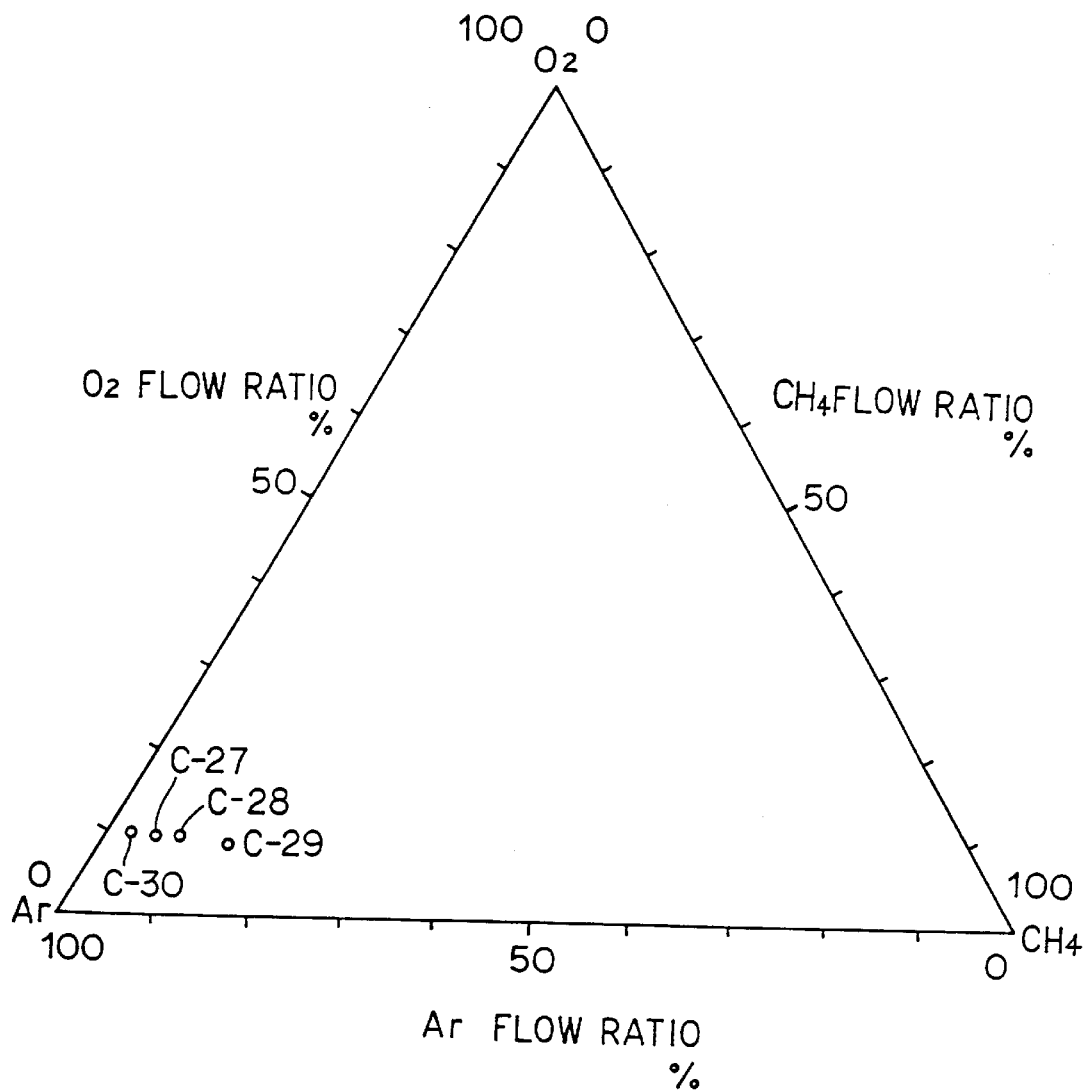
FIG. 21 is a third diagram plotting case by case a flow ratio of a mixed gas in formation of the phase shifter film in the second embodiment.
Figure 22:
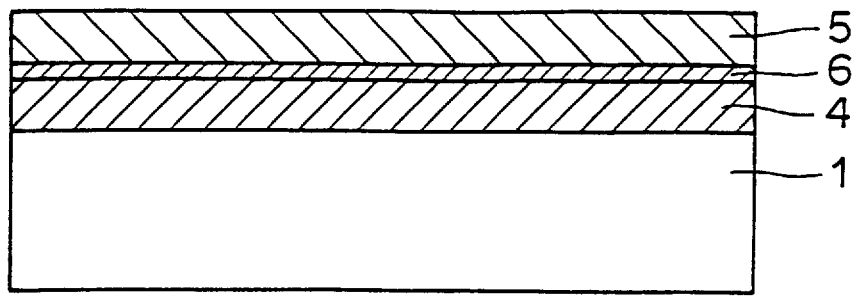
FIGS. 22 to 26 are cross sectional views showing the first to fifth steps of the manufacturing method of a phase sift mask in a third embodiment according to the present invention.

FIGS. 19 to 21 are graphs showing the above cases based on the relation of gas flow ratios in mixed gases $Ar+O_2$; $Ar+O_2+N_2$, $Ar+NO$, and $Ar+O_2+CH_4$, respectively.

The graph of FIG. 19 shows the rates of argon, oxygen and nitrogen in Cases C-1 to C-18.

In this graph, a point of a mixed gas in each case is plotted, wherein the base of the triangle indicates the flow ratio (%) of argon, the left oblique side of the triangle indicates the flow ratio (%) of oxygen, and the right oblique side of the triangle indicates the flow ratio (%) of nitrogen.

In accordance with the result in FIGS. 16, 17 and 18, a case the film of which is applicable as a phase shifter film is indicated by a circle, while a case the film of which is. not applicable as a phase shifter film is indicated by a cross.

As can be seen from the graph of FIG. 19, a mixed gas for forming a chromium oxide film applicable as a phase shifter film includes 48–97% argon and 3–39% oxygen by volume.

A mixed gas for forming a chromium nitride oxide film applicable as a phase shifter film includes 48–90% argon, 1–39% oxygen, and 6–14% nitrogen by volume.

The upper limit of oxygen is set to 39%, because the rate occupied by oxygen of 50% or more will cause deposition of an oxide on an electrode in the sputtering apparatus, thereby preventing sputtering. It is thus defined by the restriction of the apparatus.

FIG. 20 is a graph showing the rates of argon and NO in Cases C-19 to C-26. In accordance with the results in FIGS. 16, 17 and 18, a case the film of which is applicable as a phase shift mask is indicate by a circle, while a case the film of which is not applicable as a phase shifter mask is indicated by a cross.

FIG. 21 is a graph showing the rates of argon, oxygen and methane in Cases C-27 to C-30.

In the graph, a point of a mixed gas in each case is plotted, wherein the base of the triangle indicates the flow ratio (%) of argon, the left oblique side thereof indicates the flow ratio (%) of oxygen, and the right oblique side thereof indicates the flow ratio (%) of methane.

In accordance with the result in FIGS. 16, 17 and 18, a case the film of which is applicable as a phase shifter film is indicated by a circle, while a case the film of which is not applicable as a phase shifter film is indicated by a cross.

As can be seen from the graphs in FIGS. 20 and 21, a mixed gas for forming a chromium nitride oxide film applicable as a phase shifter film includes 82–87% argon, and 13–18% nitrogen monoxide by volume.

A mixed gas for forming a chromium carbide nitride oxide film applicable as a phase shifter film includes 78–88% argon, 2–13% oxygen and 8–10% methane by volume.

As described above, in the phase shift mask in accordance with the present embodiment, a second light transmit portion is constituted only of a film of a chromium oxide, a chromium nitride oxide, or a chromium carbide nitride oxide, having the transmittance of 4–50%.

In the manufacturing process thereof, a film of a chromium oxide, a chromium nitride oxide, or a chromium carbide nitride oxide is formed to a prescribed film thickness by a sputtering method, and thereafter, a prescribed etching is performed, so that the second light transmit portion is formed.

Consequently, a phase shifter film can be formed with a conventional sputtering apparatus, and probabilities of defects and errors in a pattern dimension can be reduced since etching process is required only once.

Although an oxide and a nitride oxide of molybdenum silicide, and an oxide, a nitride oxide, and a carbide nitride oxide of chromium are used as the second light transmit portion in the second and third embodiments, it is not limited to them, and an oxide and a nitride of metal, and an oxide and a nitride oxide of metal silicide may be used.

Description will now be made of a fourth embodiment in accordance with the present invention. In the present embodiment, an antistatic metal film is formed for prevention of being charged in irradiation of electron beams or laser beams on a phase shifter film in the manufacturing process thereof.

The manufacturing process of the phase shifter film will be described with reference to FIGS. 22 to 26.

FIGS. 22 to 26 are cross sectional views corresponding to the cross sectional structure of the phase shift mask shown in FIG. 1.

Referring to the figures, as in the second and third embodiments, phase shifter film 4 is formed on quartz substrate, which is made of a molybdenum silicide oxide film, a molybdenum silicide nitride oxide film, a chromium oxide film, a chromium nitride oxide film, or a chromium carbide nitride oxide film.

Thereafter, an antistatic film 6 of approximately 100–500 Å in thickness is formed on phase shifter film 4. When the film material of the phase shifter film belongs to the Mo family, a molybdenum film is to be formed as antistatic film 6. When it belongs to the Cr family, a chromium film is to be formed as antistatic film.

This is because phase shifter film 4 of a molybdenum silicide oxide, a molybdenum silicide nitride oxide, a chromium oxide, a chromium nitride oxide, or a chromium carbide nitride oxide, formed in the aforementioned method does not have conductivity.

With regard to Cases C-1 to C-3 described in connection with the third embodiment, since a chromium oxide film formed in the above cases has conductivity, the antistatic film is not required.

Subsequently, an electron beam resist film of approximately 5000 Å in thickness is formed on antistatic film 6.

Figure 23:
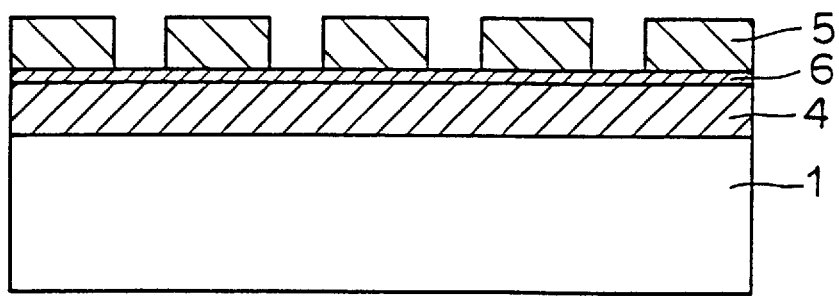

Referring to FIG. 23, resist film 5 having a desired resist pattern is formed by exposing to electron beams and developing a prescribed portion of electron beam resist film 5.

Figure 24:
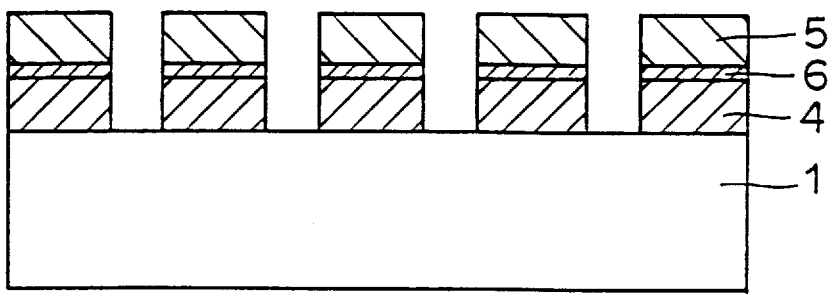

Referring to FIG. 24, sequential dry etching of antistatic film 6 and phase shifter film 4 is performed using a $CF_4+O_2$ gas, with electron beam resist film 5 as a mask when antistatic film 6 belongs to the Mo family.

Figure 25:
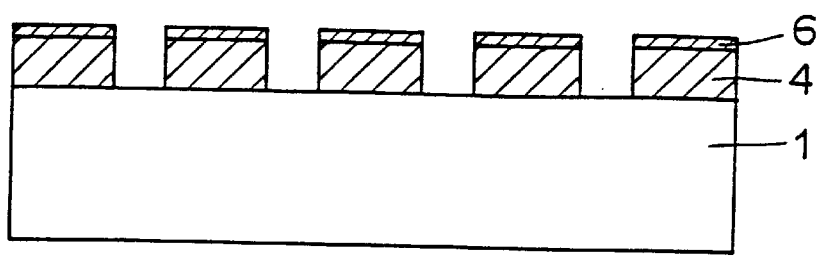
Figure 26:
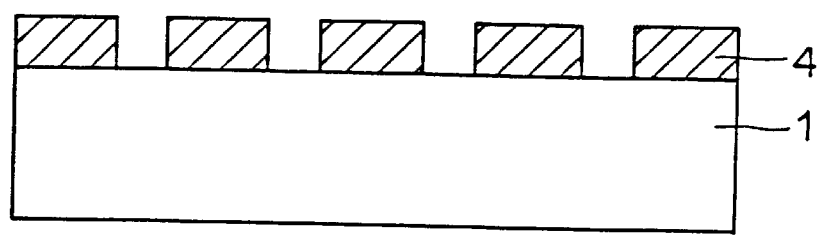

Referring to FIG. 25, resist film 5 is removed using $O_2$ plasma or the like. Referring to FIG. 26, antistatic film 6 is removed by etching with etching liquid (a mixture of ammonium ceric nitrate and perchloric acid) or the like.

The phase shift mask is thus completed.

Referring to FIG. 24 again, when antistatic film 6 belongs to the Cr family, sequential dry etching of antistatic film 6 and phase shifter film 4 is performed with a $CH_2Cl_2+O_2$ gas, a $Cl_2+O_2$ gas, or $Cl_2$ gas, with electron beam resist film 5 as a mask.

Referring to FIG. 25, resist film 5 is removed using $O_2$ plasma or the like. Referring to FIG. 26, antistatic film 6 is removed by etching with sulfuric acid.

The phase shift mask is thus completed.

Although an antistatic film of molybdenum is formed in the case of a phase shift mask belonging to the Mo family, and an antistatic film of chromium is formed in the case of a phase shift mask belonging to the Cr family in etching of the phase shift mask, the present invention is not to limited to this, and the same effects can be obtained by using an antistatic film of Mo for a phase shift mask belonging to the Cr family, or using an antistatic film belonging to the Cr family for a phase shifter film belonging to the Mo family.

As describe above, providing a molybdenum film in the manufacturing process of the phase shift mask, an antistatic effect in irradiation of light beams can be obtained. This also serves as a light reflecting film for a position detector of optical type.

Although a molybdenum film or a chromium film is used as an antistatic film in the fourth embodiment, the same effects can be obtained by using a film of W, Ta, Ti, Si, Al or the like, or alloys thereof.

Figure 27:
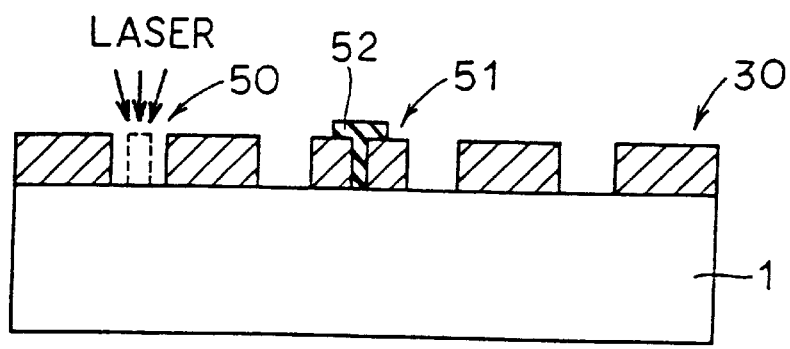
FIG. 27 is a cross sectional view showing a defect repairing method of a phase shift mask according to the present invention.

Description will be now made of methods of detecting a defect and repairing the same, when a remaining defect (an opaque defect) 50 or a pin hole defect (a clear defect) 51 occurs on the phase shift mask formed in the first to third embodiments, as shown in FIG. 27.

First, utilizing a light transmit type defect detection apparatus (manufactured by KLA, 239HR type), the presence of a defect in a manufactured phase shift mask is checked by comparing chips.

In this defect detection apparatus, the check is carried out with light emitted from a mercury lamp.

As a result, a remaining defect in which the phase shifter film remains on the pattern to be etched, and a pin hole defect in which the phase shifter film to be left is eliminated because of a pin hole or a lacked shape are detected.

These defects are then repaired. The remaining defect is repaired by a laser blow repair apparatus with a YAG laser, as in a conventional photomask.

Another method of removing the remaining defect is to perform assist-etching by FIB with a gas for sputter etching.

The pin hole defect is repaired by burying the pin hole defect portion through deposition of a carbon film 52 by FIB assist deposition method, as in a conventional photomask.

A good phase shift mask can thus be obtained without carbon film 52 being peeled off even when the repaired phase shift mask is washed.

Description will now be made of an exposure method using the above-described phase shift mask.

Figure 28:
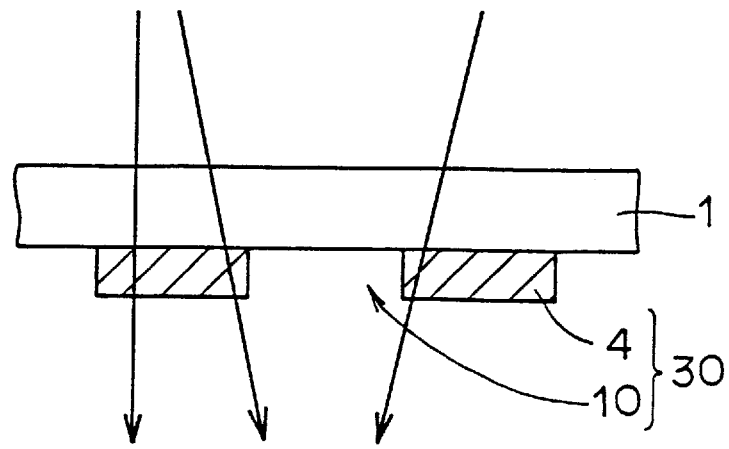
FIG. 28 is a schematic diagram showing a state of an exposure method using the phase shift mask according to the present invention.

When the phase shift mask is used, a phase shifter film is formed with the thickness of approximately 1500 Å to 2000 Å as shown in film thickness dimension (ds) of Table 2 to Table 4 and Table 6 to Table 8. Since the phase shifter film is formed with the thickness approximately half of that of a conventional phase shifter film, it is possible to convert oblique exposure light included in exposure light by 180° as shown in FIG. 28.

Figure 29:
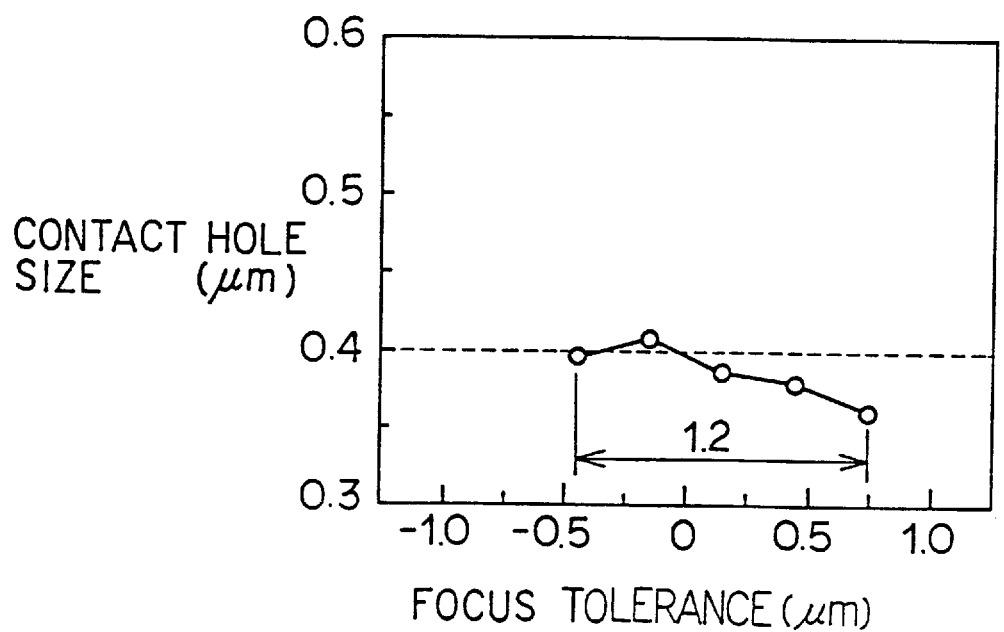
FIG. 29 is a graph showing the relationship between focus offset and contact hole size in the exposure method using the phase shift mask according to the present invention.

As a result, as shown in FIG. 29, when a contact hole of 0.4 $\mu$m is to be opened, for example, it is possible to allow focus tolerance of 1.2 $\mu$m. In the case of a conventional photomask, as shown in FIG. 30, when a contact hole of 0.4 $\mu$m was to be opened, focus offset of only 0.6 $\mu$m was allowed.

Figure 31:
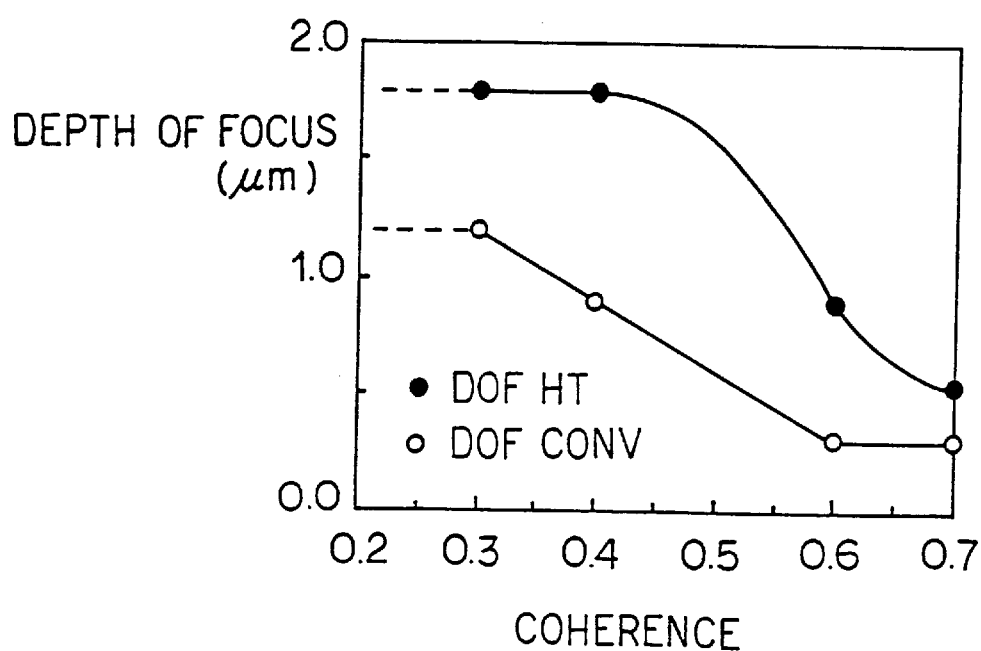
FIG. 31 is a graph showing a comparison of the relationship between coherence and depth of focus of the exposure method using the phase shift mask according to the present invention with that of the exposure method using a phase shift mask in a conventional technique.

In an exposure apparatus having coherence of 0.3 to 0.7 favorably 0.5–0.6, as shown in FIG. 31, it is possible to substantially improve depth of focus as compared to the case of the conventional photomask.

Figure 30:
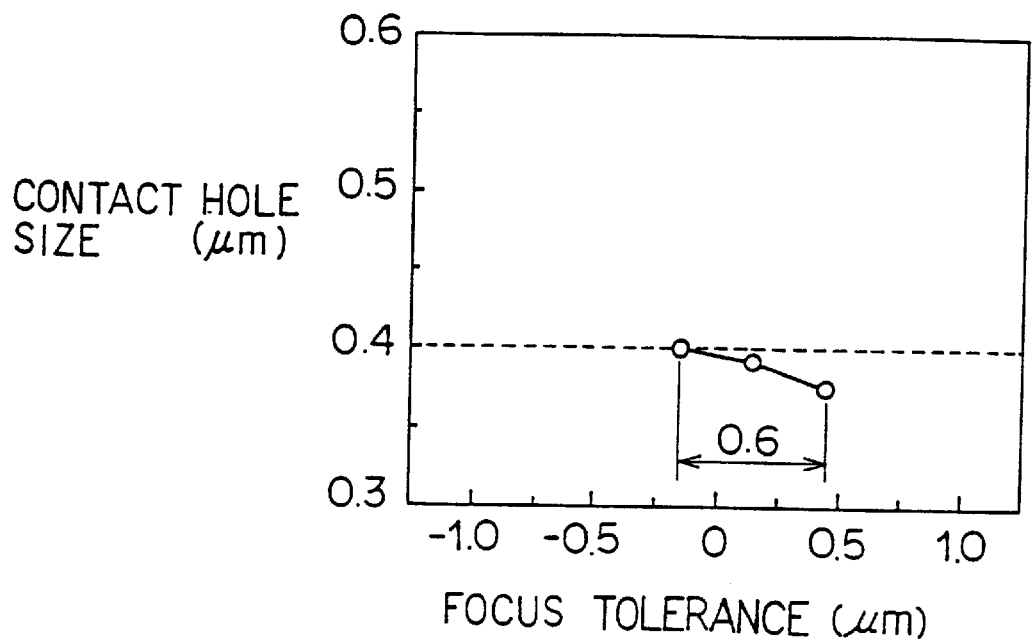
FIG. 30 is a graph showing the relationship between focus offset and contact hole size in the exposure method using a photomask in a conventional technique.

FIGS. 29 and 30 show the relationship between contact hole size and focus tolerance in the case where a reduction and projection exposure apparatus having a reduction ratio of 5:1 is used. However, it is possible to obtain similar effects with a reduction and projection exposure apparatus having a reduction ratio of 4:1 or 3:1, or projection exposure apparatus having a reduction ratio of 1:1. It is possible to obtain similar effects not only with a projection exposure apparatus but also with a contact exposure apparatus and a proximity exposure apparatus.

In addition, it is possible to obtain similar effects that a krF laser ($\lambda$=243 nm), an i-line ($\lambda$=365 nm) and a g-line ($\lambda$=436 nm) is using as exposure light.

As described above, according to the exposure method using the phase shift mask in this embodiment, since it is possible to prevent occurrence of exposure failure, it is possible to improve the yield in the manufacturing steps of a semiconductor device. The exposure method can be effectively used in the manufacturing steps of semiconductor device such as a DRAM of 4M, 16M, 64M, 256M, an SRAM, a flash memory, an ASIC (Application Specific Integrated Circuit), a microcomputer, and GaAs. Furthermore, the exposure method can be well used in the manufacturing steps of a unitary semiconductor element and a liquid crystal display.

Now, a fourth embodiment in accordance with the present invention will be described below. The above-described phase shift masks of attenuation type in the first through third embodiments have the transmittance set to 5–40%. In particular, phase shift masks of attenuation type having the transmittance of 5–15% are actually employed for development and manufacture of semiconductor devices.

Improvement in resolution of a phase shift mask of attenuation type depends on the transmittance of a phase shifter film. The higher the transmittance is, the more greatly resolution improves. Therefore, a phase shift mask of attenuation type having a high transmittance is desired. However, with the higher transmittance, a greater amount of light transmits through the phase shifter film. As a result, a resist film is undesirably exposed to the light beams transmitting through the phase shifter film a plurality of times (foggy exposure).

The resist film which should not be etched is reduced in thickness, when a positive resist film is used, by the multiple exposure, and therefore the pattern of the resist film is destroyed.

This effect of multiple exposure also depends on the contrast of the resist film.

Generally, the upper limit of the transmittance at which the resist film is not affected by multiple exposure is 15%, when the resist film used in the manufacturing steps of a semiconductor device is employed. The upper limit of the transmittance can be made higher by improvement in contrast of the resist film and other processes.

New problems have arisen as phase shift masks of attenuation type are turned into practical use and widely applied to the manufacturing processes of semiconductor devices.

First, although a resist film usually employed has a thickness of approximately 1 $\mu$m, a resist film having a thickness of approximately 2 $\mu$m is required for some manufacturing processes.

When a positive resist film is exposed to the light having a portion with the thickness of 1 $\mu$m and another with the thickness of 2 μm, which two portions have the same sensitivity, the portion with the thickness of 2 μm requires a greater amount of exposure light to form a pattern. With the greater amount of exposure light, a problem of multiple exposure of the resist film is generated by the light transmitting through the phase shift film, as described above.

Figure 32:
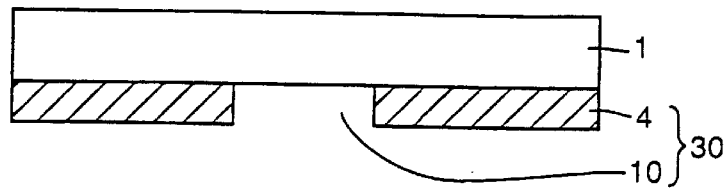
FIG. 32 is a cross sectional view showing a structure of a phase shift mask of attenuation type.
Figure 33:
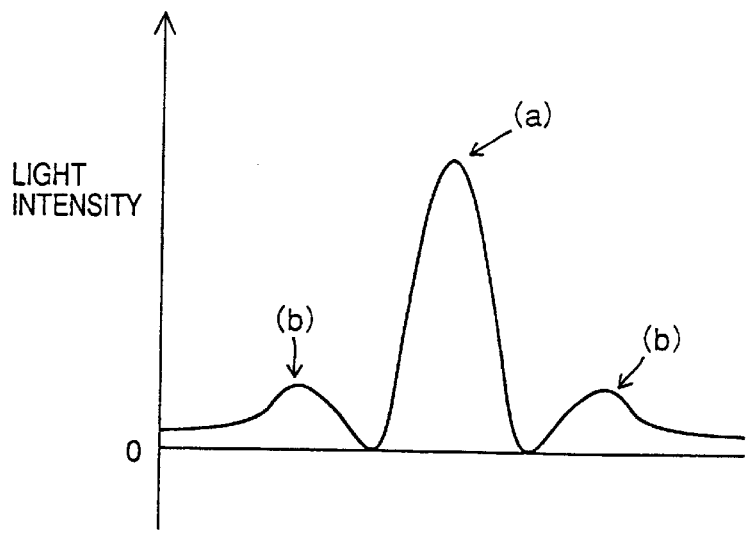
FIG. 33 shows light intensity of the light transmitting through the phase shift mask of attenuation type shown in FIG. 32.
Figure 34:
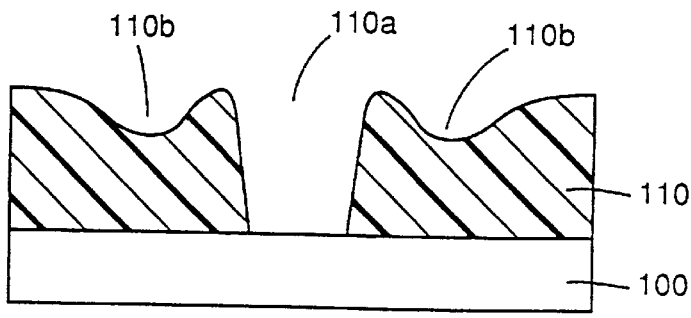
FIG. 34 is a cross sectional view showing a structure of a resist film formed by using the phase shift mask of attenuation type shown in FIG. 32.
Figure 35:
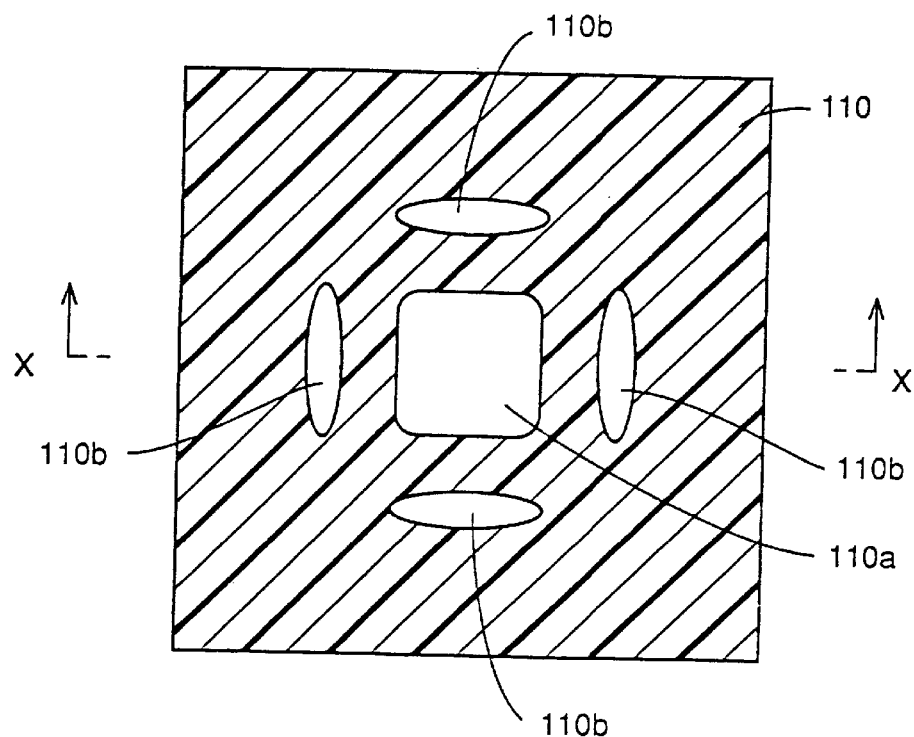
FIG. 35 shows a two-dimensional structure of the resist film formed by using the phase shift mask of attenuation type shown in FIG. 32.

Referring to FIGS. 32 and 33, description will now be made of another problem that by side lobes (b) (first-order diffraction light) of the light beams (a) transmitting through light transmit portion 10 with a hole pattern, a surrounding region of the hole pattern is exposed to the light. For example, referring to FIGS. 34 and 35, at a resist film 110 formed on a semiconductor substrate 100 an unnecessary hole 110b is formed around a hole 110a originally designed to be opened.

Although one might consider reducing the transmittance of the attenuation type phase shift mask as much as possible in the range of 5–40%, it is evident that the effects of multiple exposure and side lobes described above show up even with the transmittance of 5%

Figure 36:
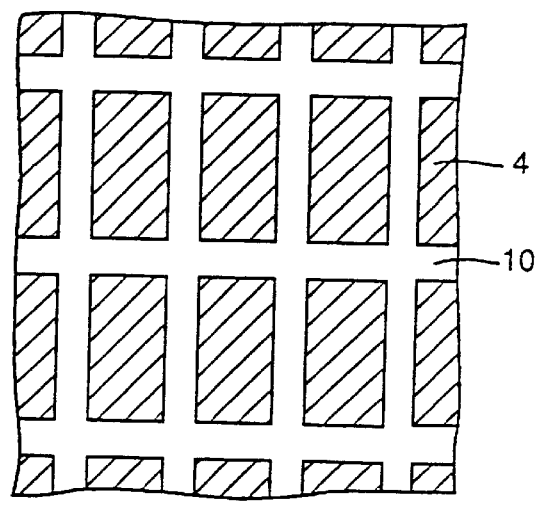
FIG. 36 is a plan view of a phase shift mask of attenuation type in which a first light transmit portion has a line pattern.

For example, when a phase shift mask of attenuation type is used which has a negative line pattern 10 as shown in FIG. 36 for forming a storage node or the like, the following problem is generated.

Figure 37:
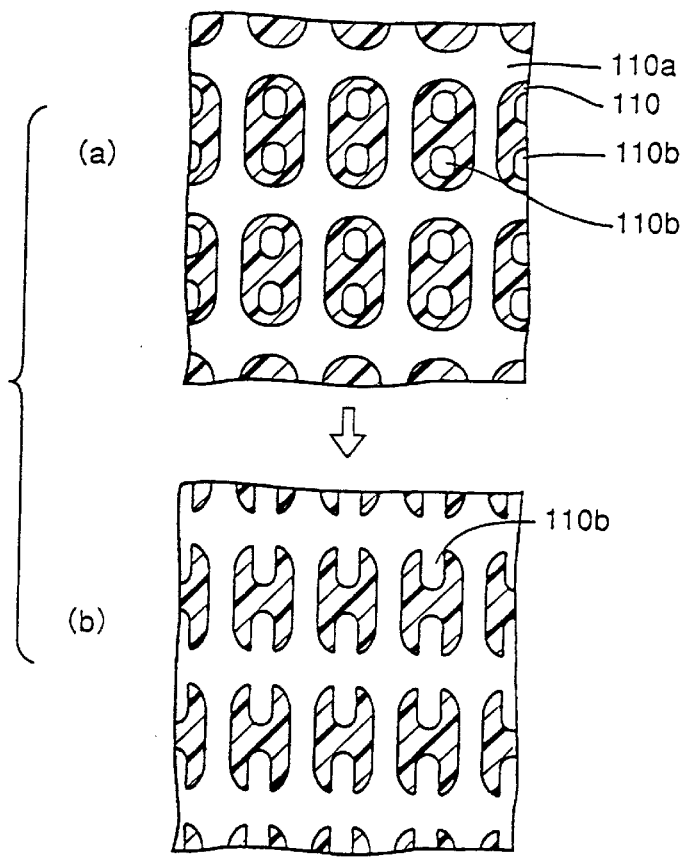
FIG. 37 is a plan view showing a structure of the resist film formed by using the phase shift mask of attenuation type shown in FIG. 36.

When the transmittance of the phase shifter film is 5% or more and the resist film is exposed to light using a mask pattern as shown in FIG. 36, a depressed portion or hole 110b is generated at the central portion of resist pattern 110 as shown in FIG. 37. This is because the side lobes generated around resist pattern 110 overlap with each other at the central portion of resist pattern 110, thereby exposing the resist film to the light.

This effect is present even with the phase shifter having the transmittance of 5%, though the effect is small.

As a result, if etching, which is the next step, is performed by using this resist film, the problems of etching failure and a drop in accuracy of the dimension of the etched material are generated due to a change in the shape of the pattern of the resist film.

A fourth embodiment is conceived for solving these problems and obtaining a phase shifter film which has such a transmittance as to improve effects of the phase shift mask of attenuation type, and a phase shift mask of attenuation type having such a phase shifter film.

It has been found that the effects of the above mentioned problems are reduced sharply and significantly if the transmittance of the phase shifter film is lowered to 5% or less. The effect becomes considerably small with transmittance of less than 5%, and especially when the transmittance is 4% or less, the above-described problems do not occur at all.

Figure 44A:
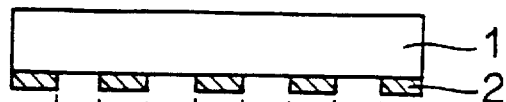
FIG. 44A is a cross sectional view of a photomask in a conventional technique.
Figure 44B:
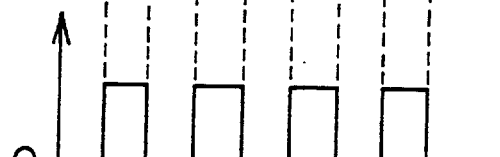
FIG. 44B is a schematic diagram showing an electric field of exposure light on the mask.
Figure 44C:
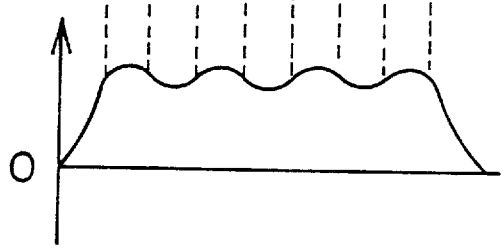
FIG. 44C is a schematic diagram showing light intensity on a wafer.
Figures 45A, 45B, 45C:
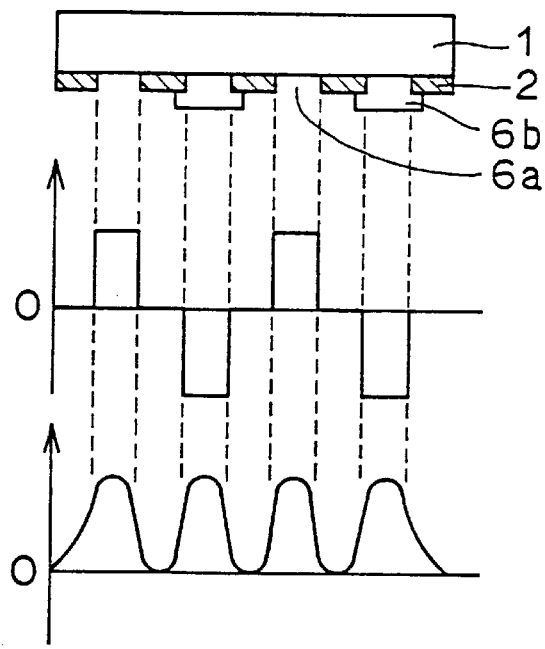
FIG. 45A is a cross sectional view of a phase shift mask in a conventional technique.
FIG. 45B is a schematic diagram showing an electric field of exposure light on the mask.
FIG. 45C is a schematic diagram showing light intensity on a wafer.
Figure 47:
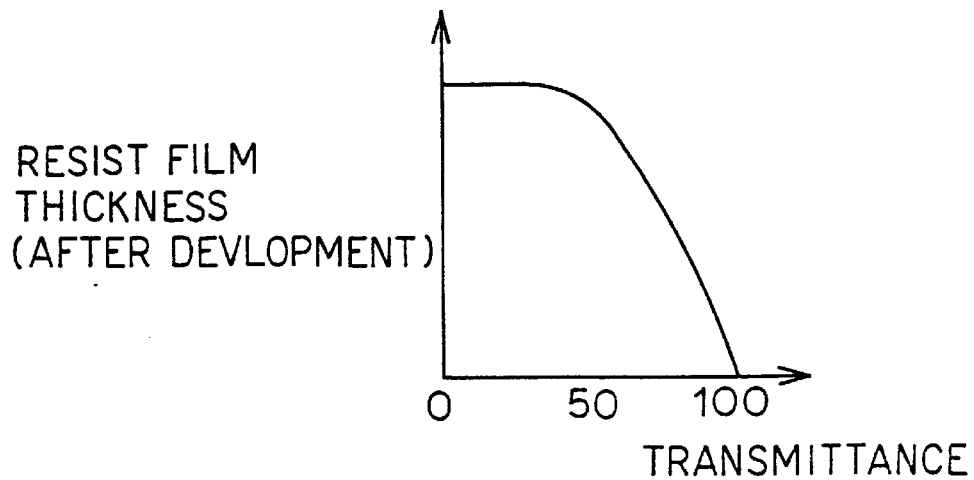
FIG. 47 is a graph showing the relation between a transmittance of exposure light and a thickness of a resist film.
Figure 48:
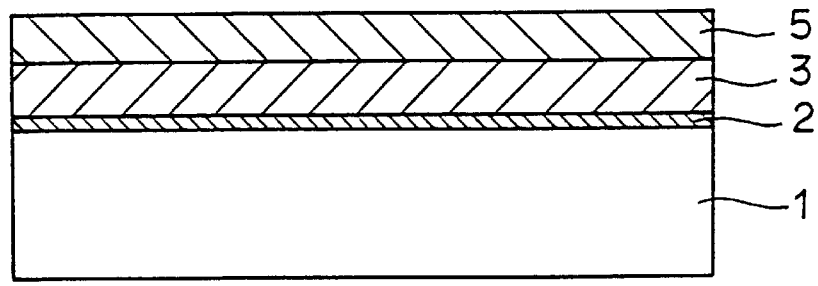
FIGS. 48 to 52 are cross sectional views showing the first to fifth steps of a manufacturing method of a phase shift mask in a conventional technique.
Figure 49:
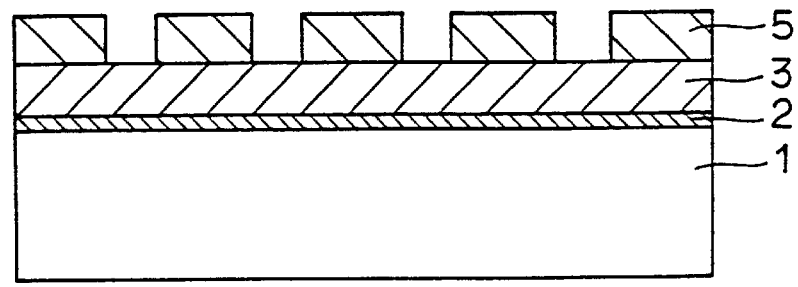
Figure 50:
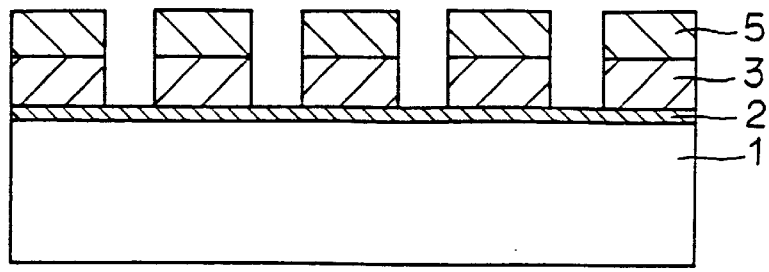
Figure 51:
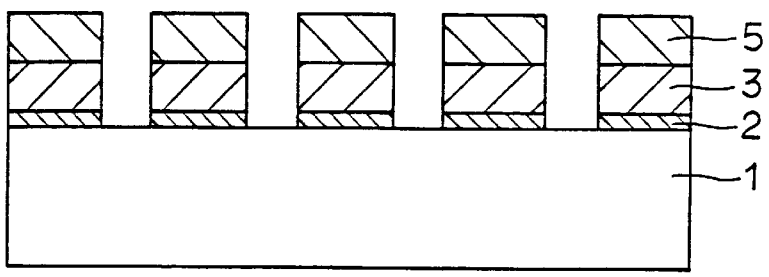
Figure 52:
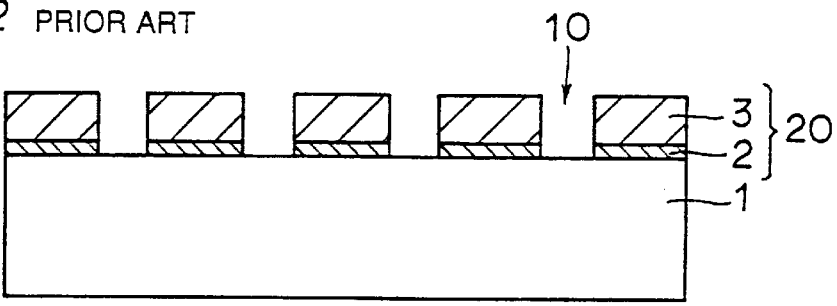
Figure 53:
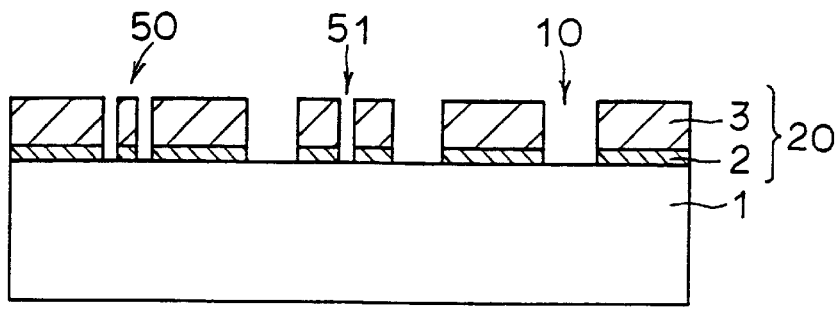
FIG. 53 is a cross sectional view showing a problem of the phase shift mask in the conventional technique.
Figure 54:
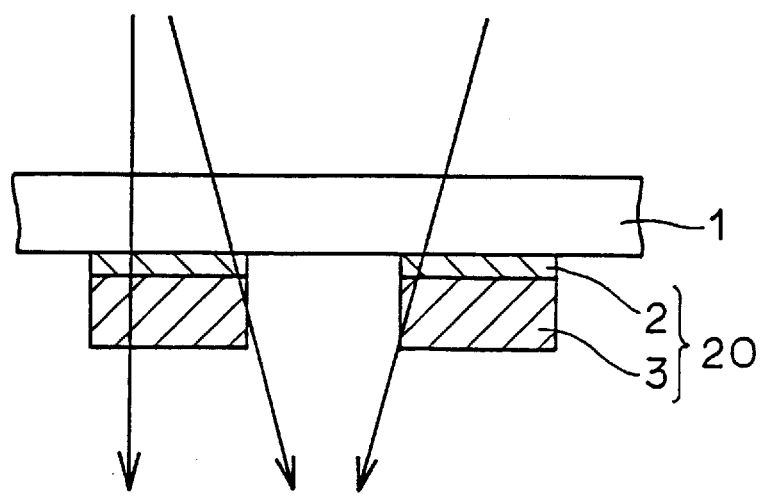
FIG. 54 is a diagram showing a problem of the exposure method using a phase shift mask in a conventional technique.

However, if the transmittance of the phase shifter film is lowered, it becomes close to that of the conventional photomask shown in FIG. 44A, whereby improvement in resolution becomes small.

Figure 38:
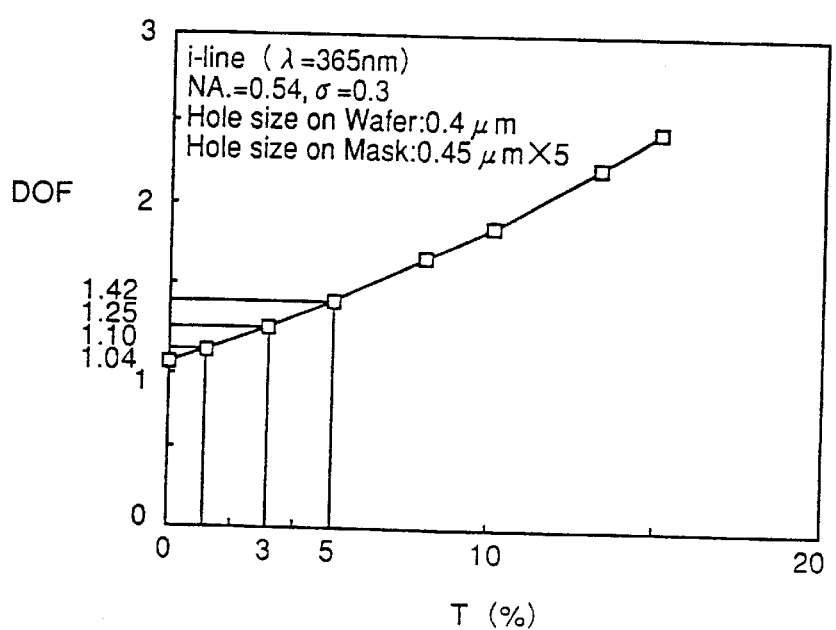
FIG. 38 is a graph showing the relation between transmittance T (%) and depth of focus (DOF).

In this regard, FIG. 38 shows the relation between resolution and the transmittance when the transmittance of the phase shift mask is less than 5%. As can be seen from the result shown in FIGS. 38 and 39, regarding the transmittance of the phase shifter film being less than 5%, the transmittance of 2% or more is required for improvement in resolution.

Therefore, the range of the transmittance for solving the aforementioned problems and also obtaining effects of a phase shift mask of attenuation type is required to be at least 2% and less than 5%.

Now, a method of manufacturing a phase shift mask of attenuation type including a phase shifter film which has the transmittance of at least 2% and less than 5% and the phase angle of 180° and which is made of a single material.

First, an example in which a phase shifter film made of molybdenum silicide oxide and molybdenum silicide nitride oxide is used will be described below.

The sputtering device similar to the one shown in FIG. 7 is used for forming the above-mentioned film.

Referring to FIG. 8 and Table 2, which have been already described above, when krF laser is used as exposure light, the transmittance of at least 2% and less than 5% required for a phase shifter film is obtained in M-2, M-3, M-7, M-9, and M-14 to M-16.

Referring to FIG. 9 and Table 3 showing the cases of exposure light of the i-line, it can be seen that the transmittance T of at least 2% and less than 5% required for a phase shifter film is obtained in M-4 to M-7.

Referring to FIG. 10 and Table 4 showing the cases of exposure light of the g-line, it can be seen that the transmittance T of at least 2% and less than 5% required for a phase shifter film is obtained in M-4 to M-6.

As a result, the film formed in M-2 to M-7, M-9, and M-14 to M-16 can be employed as a phase shifter film having transmittance T of at least 2% and less than 5%.

Figure 40:
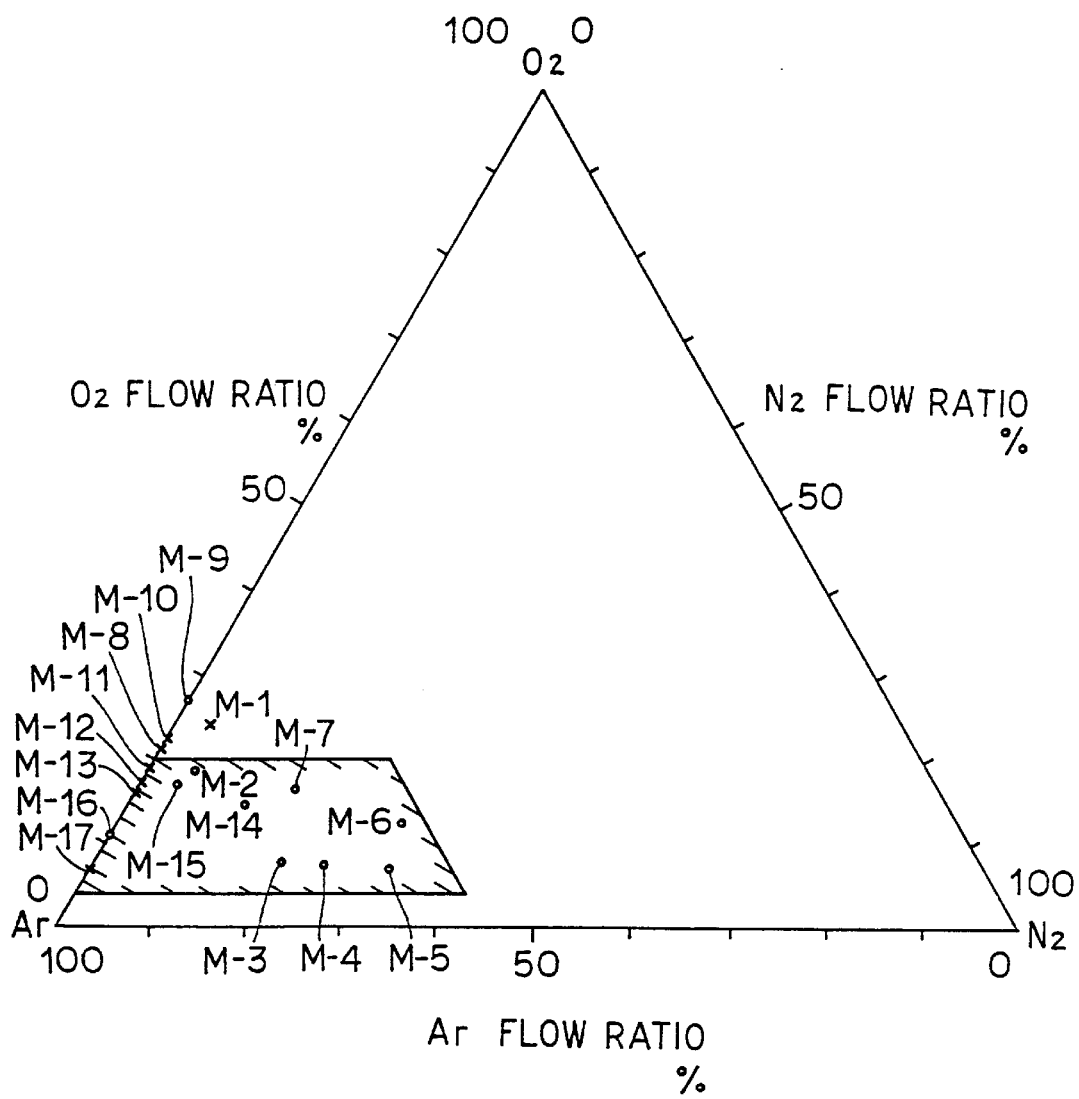
FIGS. 40–43 are first through fourth diagrams each plotting case by case a flow ratio of a mixed gas in formation of the phase shifter film in the fourth embodiment.

FIG. 40 is a graph showing the above cases with respect to gas flow ratios. In the graph shown in FIG. 40, respective rates of argon, oxygen and nitrogen in cases M-1 to M-17 are described.

In this graph, a point of a mixed gas in each case is plotted, wherein the base of the triangle indicates the flow ratio (%) of argon, the left oblique side thereof indicates the flow ratio (%) of oxygen, and the right oblique side thereof indicates the flow ratio (%) of nitrogen. In accordance with the result shown in FIGS. 8–10 and Tables 2–4, a case the film of which is applicable as a phase shifter film having transmittance T of at least 2% and less than 5% is indicated by a circle, while a case the film of which is not applicable to a phase shifter film having the transmittance of at least 2% and less than 5% is indicated by a cross.

As can be seen from the graph in FIG. 40 and from Table 1, a mixed gas for forming a molybdenum silicide oxide film applicable as a phase shifter film with the transmittance T of at least 2% and less than 5% includes 73–76% argon and 24–27% oxygen by volume.

A mixed gas for forming a molybdenum silicide nitride oxide film applicable as a phase shifter film with transmittance T of at least 2% and less than 5% includes 57–79% argon, 7–18% oxygen and 4–32% nitrogen by volume.

As described above, in the phase shifter mask in accordance with the present invention, a phase shifter film forming a second light transmit portion and having the transmittance of at least 2% and less than 5% is constituted only of molybdenum silicide oxide film or a molybdenum silicide nitride oxide film.

In the manufacturing process thereof, a molybdenum silicide oxide or a molybdenum silicide nitride oxide is formed to a prescribed film thickness by a sputtering method, and thereafter, a prescribed etching is performed, whereby the second light transmit portion is formed.

Consequently, a phase shifter film can be formed with a conventional sputtering apparatus, and additionally, probabilities of defects and errors in a pattern dimension can be reduced because etching process is required only once.

Description will be made of an example in which either of a chromium oxide film, a chromium nitride oxide film, and chromium carbide nitride oxide film is employed as a phase shifter film.

The process for manufacturing the phase shift mask in which either of a chromium oxide film, a chromium nitride oxide film, and a chromium carbide nitride oxide film is employed as a phase shifter film is identical to the process shown in FIGS. 12–15, and therefore the description thereof will not be repeated.

Description will be made of a formation of a phase shift film made of a chromium oxide film, a chromium nitride oxide film, and a chromium carbide nitride film will be described.

Table 5 shows the pressure in vacuum vessel, the deposition rate and the film material in each of the cases in which various flow ratios of a mixed gas are set. A phase shifter film of a chromium oxide is to be formed in cases C-1 to C13, a phase shifter film of a chromium nitride oxide is to be formed in cases C-14 to C-26, and a phase shifter film of a chromium carbide nitride oxide is to be formed in cases C-27 to C-30.

Tables 6–8 show the transmittance, the n value and the k value in the optical constant (n−i·k) and the film thickness $d_s$ for converting a phase of exposure light by 180° in the cases employing a krF laser ($\lambda$=248 nm), and i-line ($\lambda$=365 nm) and a g-line ($\lambda$=436 nm), respectively.

In Tables 6–8, the film thickness $d_s$ can be obtained from the following:

$$d_s = \lambda/2(n-1) \quad (2)$$

where $\lambda$ is a wavelength of exposure light, and n is a value in the optical constant.

FIGS. 16–18 are graphs of data shown in Tables 6–8. The horizontal axis indicates the n value in the optical constant, the left vertical axis indicates the k value in the optical constant, and the right vertical axis indicates the film thickness $d_s$.

The transmittance T is also shown in FIGS. 16 to 18.

Referring to FIG. 16 and Table 6 showing the case of exposure light of the krF laser, it can be seen that the transmittance T of at least 2% and less than 5% required for a phase shifter film is obtained in C13, and C-25.

Referring to FIG. 17 and Table 7 showing the case of exposure light of the i-line, it can be seen that the transmittance T of at least 2% and less than 5% required for a phase shifter mask is obtained in C-17 and C-29.

Referring to FIG. 18 and Table 8 showing the case of exposure light of the g-line, it can be seen that the transmittance T of at least 2% and less than 5% required for a phase shifter film is obtained in C-21, C-23 and C-26.

As a result, the films formed in cases C13, C-17, C-21, C-23, C-25, C-26 and C-29 can be employed as a phase shifter film having transmittance T of at least 2% and less than 5%.

Figure 41:
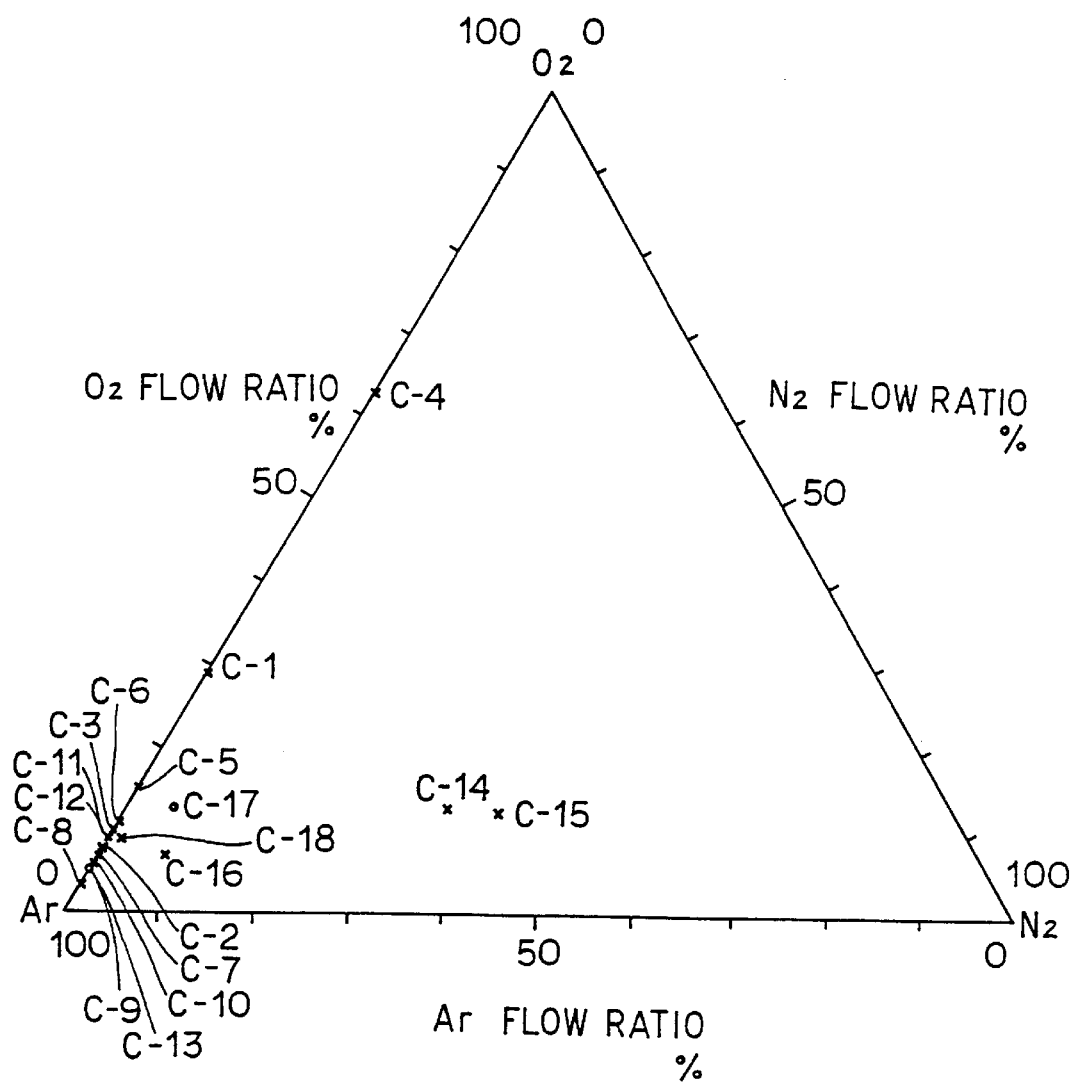
Figure 42:
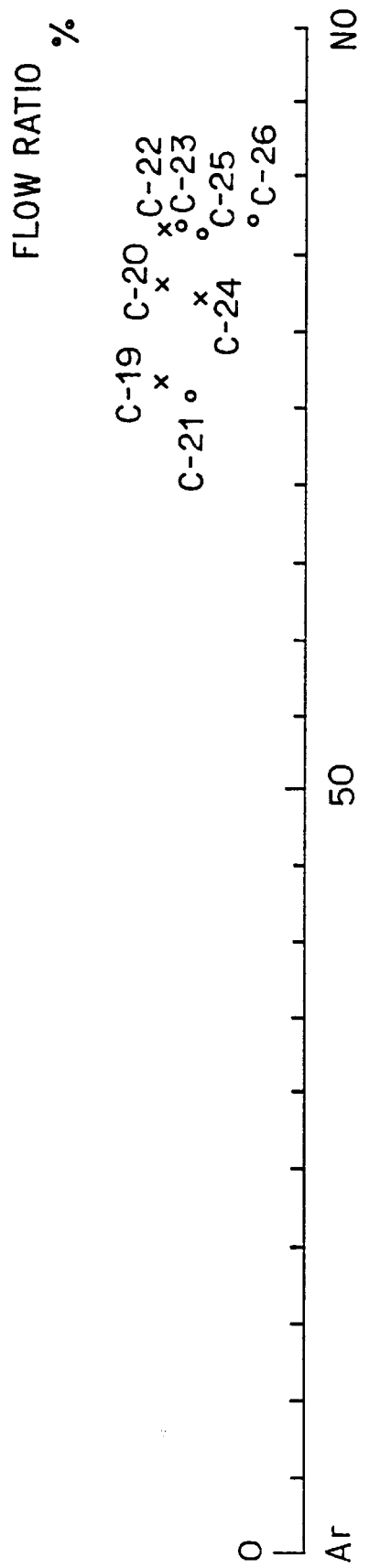
Figure 43:
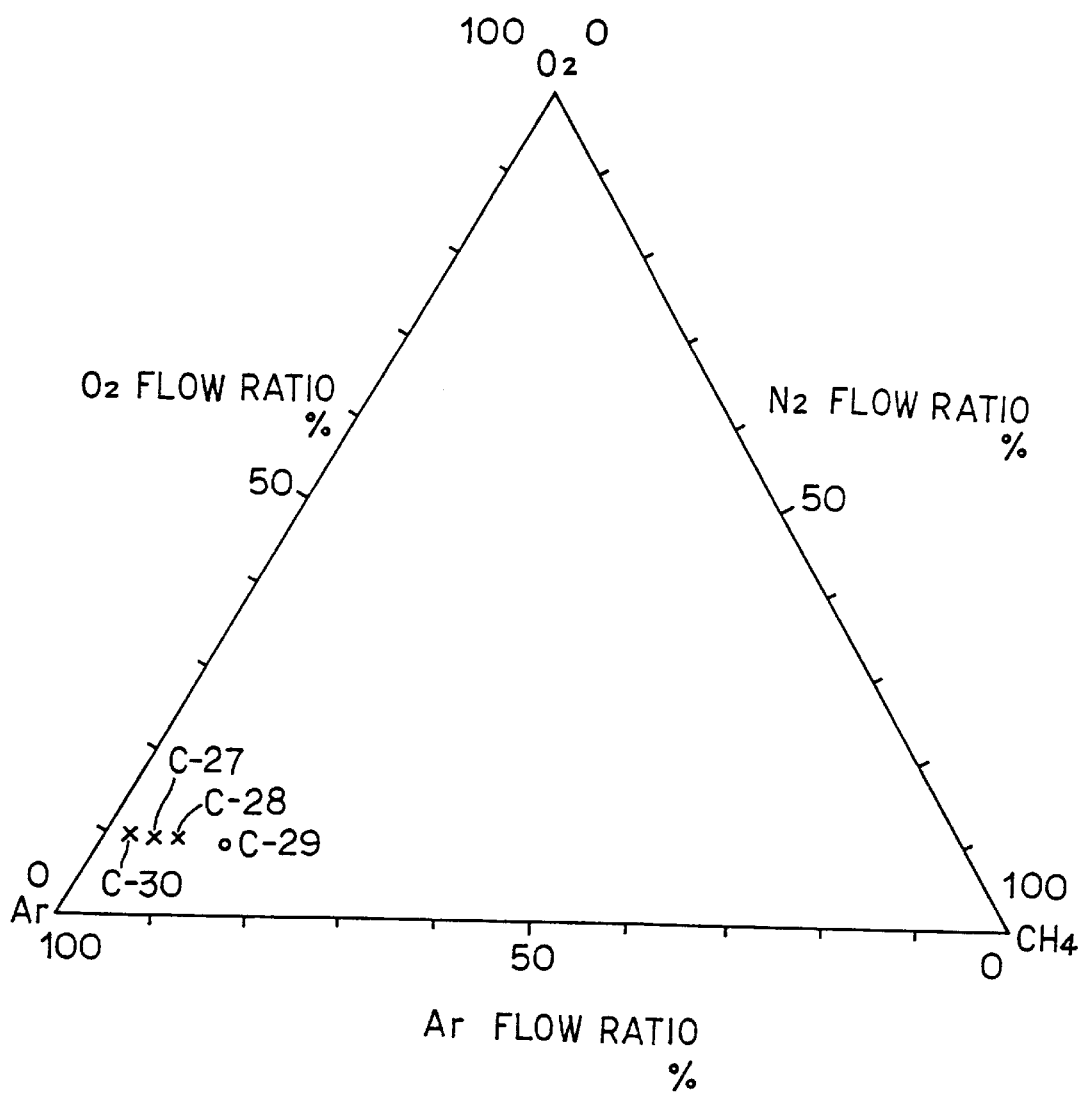

FIGS. 41–43 are graphs showing the above cases based on the relation of gas flow ratios in the mixed gas Ar+$O_2$; Ar+$O_2$+$N_2$, Ar+NO, Ar+$O_2$+$CH_6$, respectively. The graph shown in FIG. 41 shows the rates of argon, oxygen and nitrogen in Cases C-1 to C-18.

In this graph, a point of a mixed gas in each case is plotted, wherein the base of the triangle indicates the flow ratio (%) of argon, the left oblique side of the triangle indicates the flow ratio (%) of oxygen, and the right oblique side of the triangle indicates the flow ratio (%) of nitrogen.

In accordance with the result in FIGS. 16–18 and Table 5, a case the film of which is applicable as a phase shifter film having the transmittance T of at least 2% and less than 5% is indicated by a circle, while a case the film of which is not applicable as a phase shifter film is indicated by a cross.

As can be seen from the graph in FIG. 41, a mixed gas for forming a chromium oxide film applicable as a phase shifter film having transmittance T of at least 2% and less than 5% includes 95–96% argon and 4–5% oxygen by volume.

A mixed gas for forming a chromium nitride oxide film applicable as a phase shifter film having transmittance T of at least 2% and less than 5% includes 82–83% argon, 4–5% oxygen, and 12–13% nitrogen by volume.

FIG. 42 is a graph showing the rates of argon and NO in Cases C-19 to C-26. In accordance with the result in FIGS. 16–18 and Table 5, a case the film of which is applicable as a phase shifter film with a transmittance T of at least 2% and less than 5% is indicated by a circle, while a case the film of which is not applicable as a phase shifter film is indicated by a cross.

FIG. 43 is a graph showing the rates of argon and methane in Cases C-27 to C-30.

In the graph, a point of a mixed gas in each case is plotted, wherein the base of the triangle indicates the flow ratio (%) of argon, the left oblique side thereof indicates the flow ratio (%) of oxygen, and the right oblique side thereof indicates the flow ratio (%) of methane.

In accordance with the result in FIGS. 16–18 and Table 5, a case the film of which is applicable as a phase shifter film is indicated by a circle, while a case the film of which is not applicable as a phase shifter film is indicated by a cross.

As can be seen from the graphs in FIGS. 41–43 and Table 5, a mixed gas for forming a chromium nitride oxide film applicable as a phase shifter film includes 75–87% argon, and 12–25% nitrogen monoxide by volume.

A mixed gas for forming a chromium carbide nitride oxide film applicable as a phase shifter film includes 78–79% argon, 12–14% oxygen, and 8–9% methane by volume.

As described above, in this phase shifter film, a second light transmit portion is constituted only of a film of a chromium oxide, a chromium nitride oxide, or a chromium carbide nitride oxide, having the transmittance of at least 2% and less than 5%.

The above-described film is formed to a prescribed film thickness by a sputtering method, and thereafter, a prescribed etching is performed, so that the second light transmit portion is formed.

Consequently, a phase shifter film can be formed with a conventional sputtering apparatus, and probabilities of defects and errors in exposure dimension can be reduced since etching process is required only once.

Although an oxide and a nitride oxide of molybdenum silicide, and an oxide, a nitride oxide, and a carbide nitride oxide of chromium are used as the second light transmit portion as described above, it is not limited thereto, and an oxide and a nitride of metal, and an oxide and a nitride oxide of metal silicide may be used.

In the phase shift mask in accordance with the present invention, a second light transmit portion is made only of a single material film.

Additionally, in the manufacturing process of the phase shift film, the second light transmit portion is formed by forming a prescribe phase shifter film on a substrate transmitting exposure light by a sputtering method, and thereafter, performing a prescribed etching.

This enables formation of a phase shifter film at a single step with a conventional sputtering apparatus. Moreover, since etching process is required only once, probabilities of defects and errors in the pattern dimension will be decreased, so that a phase shift mask of high quality can be provided.

Although the present invention has been described and illustrated in detail, it is clearly understood that the same is by way of illustration and example only and it not to be taken by way of limitation, the spirit and scope of the present invention being limited only by the terms of the appended claims.

What is claimed is:

1. A method of detecting a remaining defect (black defect), or a pin hole defect (white defect) in a second light transmission portion of a phase shift mask including a substrate transmitting exposure light and a phase shift pattern having a first light transmission portion exposing said substrate and said second light transmission portion having a phase of transmitted exposure light converted by 180° with respect to the phase of exposure light transmitted through said first light transmission portion, having a transmittance of at least 2% and less than 5% and being formed of a single film selected from the group consisting of an oxide film of a metal, a nitride oxide film of a metal, an oxide film of metal silicide and a nitride oxide film of metal silicide, which method comprises detecting a defect by a chip comparison method using a mercury lamp as a light source.

2. A method of repairing a remaining defect (black defect) generated in a second transmission portion of a phase shift mask including a substrate transmitting exposure light and a phase shift pattern formed on a main surface of the substrate, said phase shift pattern having a first light transmission portion exposing the substrate, and said second light transmission portion having a phase of transmitted exposure light having a phase converted by 180° with respect to the phase of exposure light transmitted through said first light transmission portion, having a transmittance of at least 2% and less than 5%, and formed of a single film selected from the group consisting of an oxide film of a metal, a nitride oxide film of a metal, an oxide film of metal silicide, and a nitride oxide film of metal silicide, which method comprise removing the remaining defect (black defect) in said second light transmission portion by sputter-etching using a YAG laser or FIB.

3. A method of repairing a pin hole defect (white defect) generated in a second light transmission portion of a phase shift mask including a substrate transmitting exposure light and a phase shift pattern formed on a main surface of the substrate, said phase shift pattern having a first light transmission portion exposing the substrate and said second light transmission portion having a phase of transmitted exposure light converted by 180° with respect to the phase of exposure light transmitted through said first light transmission portion, having a transmittance of at least 2% and less than 5%, and being formed of a single film selected from the group consisting of an oxide film of a metal, a nitride oxide film of a metal, an oxide film of metal silicide and a nitride oxide film of metal silicide, which method comprises filling the pin hole defect (white defect) generated in said second light transmission portion by deposition of a carbon-based film employing an FIB assisted deposition method.

* * * * *